(12) United States Patent
Ito et al.

(10) Patent No.: US 6,977,411 B2
(45) Date of Patent: Dec. 20, 2005

(54) SEMICONDUCTOR DEVICE COMPRISING TRANSISTORS HAVING CONTROL GATES AND FLOATING GATE ELECTRODES

(75) Inventors: Masaki Ito, Kawasaki (JP); Masaya Katayama, Kawasaki (JP); Takaaki Furuyama, Aichi (JP); Shozo Kawabata, Aichi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/738,025

(22) Filed: Dec. 18, 2003

(65) Prior Publication Data

US 2004/0129970 A1    Jul. 8, 2004

(30) Foreign Application Priority Data

Dec. 20, 2002 (JP) .............................. 2002-369463

(51) Int. Cl.[7] ........................ H01L 29/788; H01L 29/76

(52) U.S. Cl. ........................ 257/318; 257/316; 257/319

(58) Field of Search .............................. 257/315, 316, 257/318, 319; 438/262, 266

(56) References Cited

U.S. PATENT DOCUMENTS 6,410,389 B1 * 6/2002 Cappelletti et al. ......... 438/257

FOREIGN PATENT DOCUMENTS

JP        5-55602       3/1993
JP     2002-15587       1/2002

* cited by examiner

*Primary Examiner*—Hung Vu
(74) *Attorney, Agent, or Firm*—Westerman, Hattori, Daniels & Adrian, LLP

(57) ABSTRACT

The semiconductor device comprises a first well 14 of a first conduction type formed in a semiconductor substrate 10; a second well 16 of a second conduction type formed in the first well 14; and a transistor 40 including a control gate 18 formed of an impurity region of the first conduction type formed in the second well 16, a first impurity diffused layer 26 and a second impurity diffused layer 33 formed with a channel region 25 therebetween, and a floating gate electrode 20 formed on the channel region 25 and the control gate 18 with a gate insulation film 24 therebetween. The control gate 18 is buried in the semiconductor substrate 10, which makes it unnecessary to form the control gate 18 on the floating gate electrode 20. Thus, the memory transistor and the other transistors, etc. can be formed by the same fabricating process. Thus, the fabrication processes can be less and the semiconductor device can be inexpensive.

19 Claims, 28 Drawing Sheets

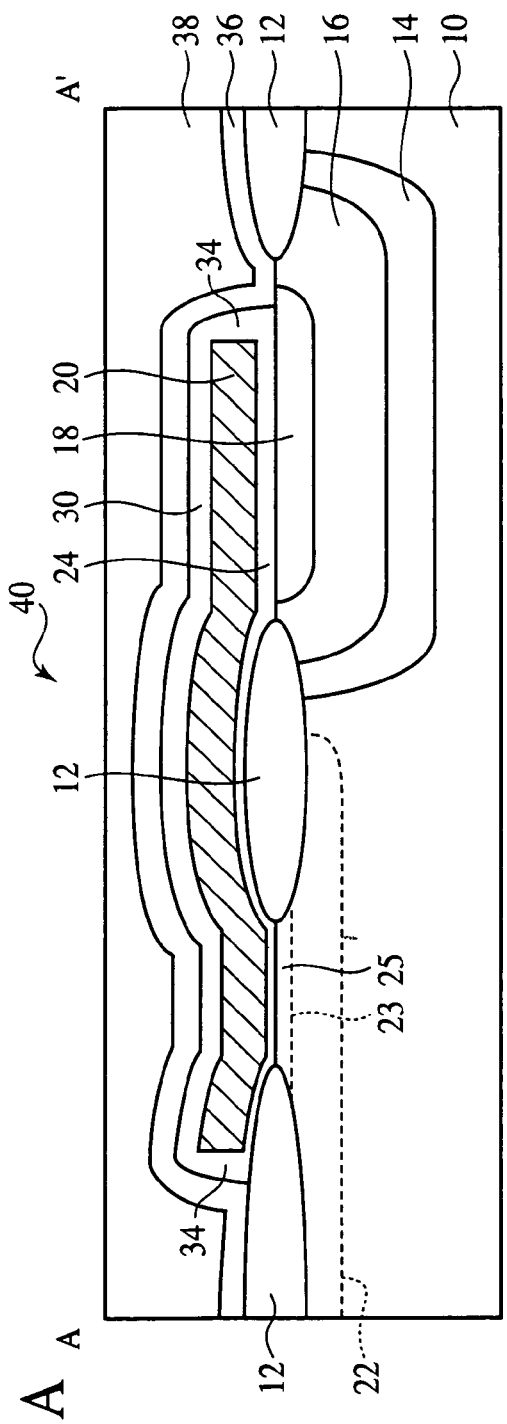
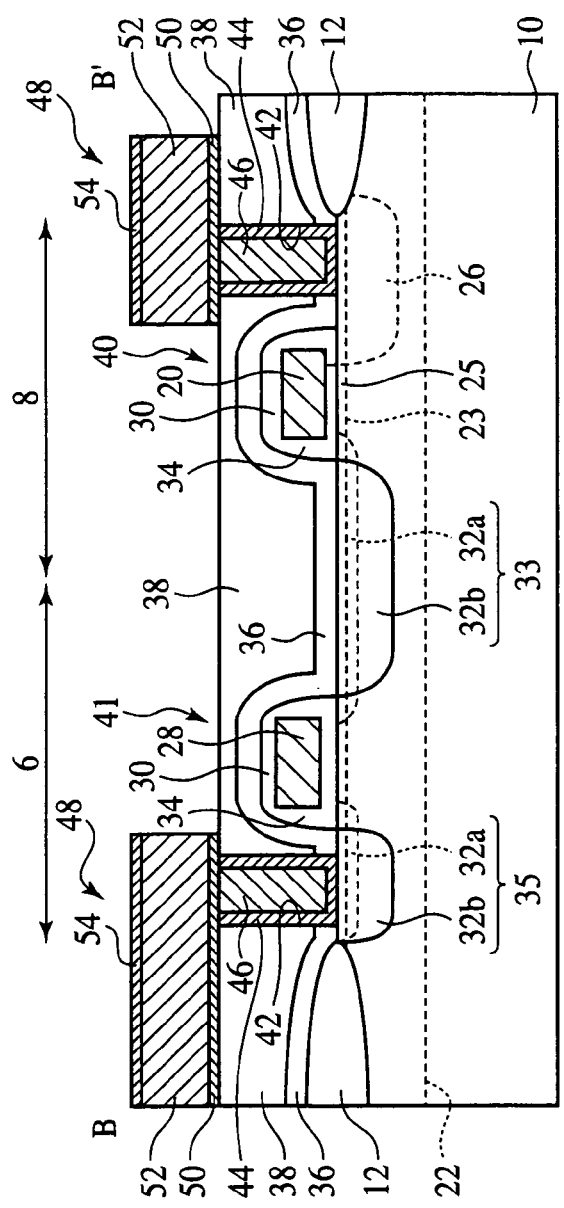
FIG. 1A
FIG. 1B

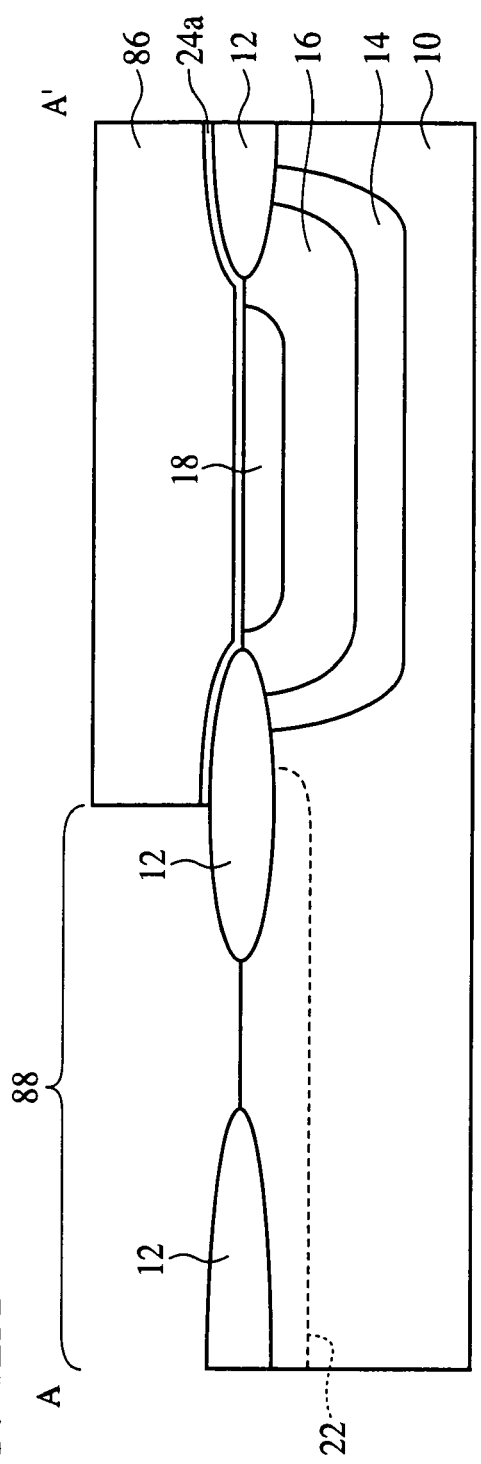
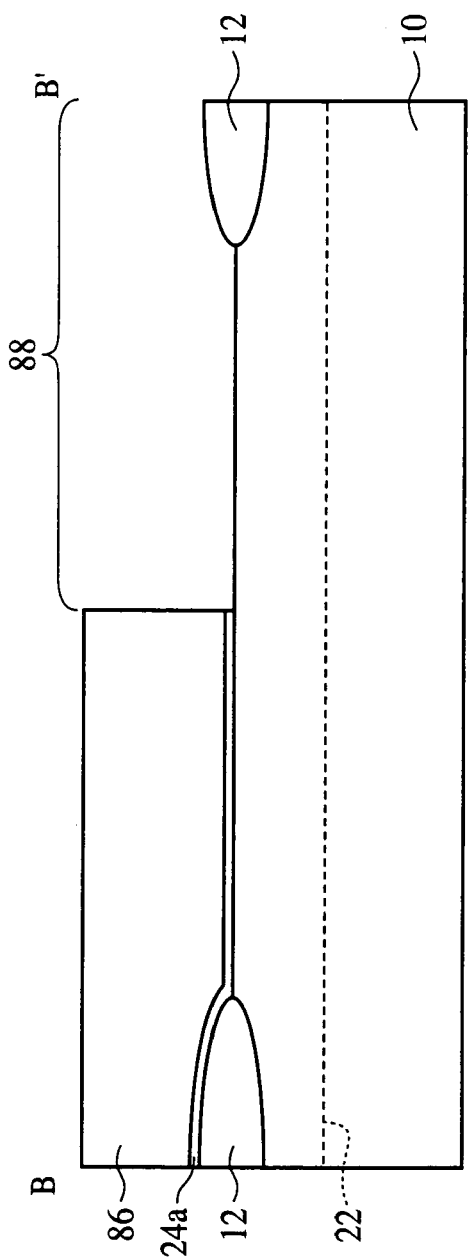
FIG. 12A
FIG. 12B

SEMICONDUCTOR DEVICE COMPRISING TRANSISTORS HAVING CONTROL GATES AND FLOATING GATE ELECTRODES

CROSS-REFERENCE TO RELATED APPLICATION

This application is based upon and claims priority of Japanese Patent Application No. 2002-369463, filed on Dec. 20, 2002, the contents being incorporated herein by reference.

BACKGROUND OF THE INVENTION

The present invention relates to a semiconductor device and a method for fabricating the semiconductor device, more specifically a semiconductor device comprising transistors having control gates and floating gate electrodes, and a method for fabricating the semiconductor device.

As a typical semiconductor memory is known DRAM (Dynamic Random Access Memory). DRAM is a semiconductor memory which stores 1-bit information in one memory cell comprising one MISFET and one capacitor. DRAM has the memory cells increasingly micronized and the capacity increased. However, semiconductor memories having larger capacities are expected.

As a semiconductor device which can have larger capacities, the flash memory is noted. The flash memory is suitable to have large capacities because one memory cell of the flash memory comprises one MISFET alone.

A conventional semiconductor device will be explained with reference to FIG. 28. FIG. 28 is a sectional view of the conventional semiconductor device.

As shown in FIG. 28, device isolation regions 212 are formed on the surface of a semiconductor substrate 210. A floating gate 220 is formed on the semiconductor substrate 210 with a gate insulation film 224 formed therebetween. A control gate electrode 218 is formed on the floating gate electrode 220 with an insulation film 221 formed therebetween. A sidewall insulation film 234 is formed on the side walls of the floating gate electrode 220 and the control gate electrode 218. A source/drain region 232 is formed in the semiconductor substrate 210 on both sides of the control gate electrode 218 and the floating gate electrode 220 with the sidewall insulation film 234 formed on the side walls thereof. Thus, the conventional flash memory, i.e., the conventional semiconductor device is constituted.

In such semiconductor device, carriers are injected into the floating gate electrode 220 to store information. When carriers are injected into the floating gate electrode 220, hot carriers are generated in the channel region between the source region 232 and the drain region 232 while a voltage is applied between the channel region and the control gate electrode 218. When the voltage is applied between the channel region and the control gate electrode 218, hot carriers are injected into the floating gate electrode 220. Thus, information is stored in the floating gate electrode 220.

Following references disclose the background art of the present invention.

[Patent Reference 1]
Specification of Japanese Patent Application Unexamined Publication No. 2002-15587

[Patent Reference 2]
Specification of Japanese Patent Application Unexamined Publication No. Hei 5-55602

However, in the conventional semiconductor device, when memory transistors 240 are formed, the control gate electrodes 218 are stacked on the floating gate electrodes 220. Accordingly, transistors for peripheral part and a select part, and the memory transistors 240 must be formed by different fabrication processes. The fabrication steps are accordingly increased, which is a barrier to the cost reduction. The conventional semiconductor device, in which hot carriers are injected into the floating gate electrodes 220, has large current consumption.

SUMMARY OF THE INVENTION

An object of the present invention is to provide a semiconductor device including a floating gate electrode and a control gate, which can realize the lower current consumption and the cost reduction, and a method for fabricating the semiconductor device.

According to one aspect of the present invention, there is provide a semiconductor device comprising: a first well of a first conduction type formed in a semiconductor substrate; a second well of a second conduction type formed in the first well; and a transistor including a control gate formed of an impurity region of the first conduction type formed in the second well, a first impurity diffused layer and a second impurity diffused layer formed outside the first well with a channel region therebetween, and a floating gate electrode formed on the channel region and the control gate with a gate insulation film therebetween.

According to another aspect of the present invention, there is provided a method for fabricating a semiconductor device comprising a control gate and a floating gate electrode, the method comprising the steps of: forming a first well of an impurity region of a first conduction type in a semiconductor substrate; forming a second well of an impurity region of a second conduction type in the first well; forming a control gate of an impurity region of the first conduction type in the second well; and forming a floating gate electrode on the semiconductor substrate containing the upper surface of the control gate with the gate insulation film therebetween.

According to the present invention, the control gate is buried in the semiconductor substrate, which makes it unnecessary to form the control gate on the floating gate electrode. According to the present invention, the memory transistor and the other transistors, etc. can be formed by the same fabricating process. Thus, according to the present invention, the fabrication processes can be less and the semiconductor device can be inexpensive.

According to the present invention, a second well of a second conduction type is formed in a first well of a first conduction type formed in the semiconductor substrate, and the control gate of an impurity diffused layer of the first conduction type is formed in the second well, whereby even with the control gate buried in the semiconductor substrate, no special problem takes place, and furthermore, the current consumption increase can be prevented.

According to the present invention, the tunnel current is used in writing and erasing information, which permits information to be written and erased with small current consumption. According to the present embodiment, information can be written and erased by using the tunnel current without generating hot carriers. The semiconductor device according to the present embodiment can have small current consumption.

According to the present invention, the area of the first region where the floating gate electrode and the control gate are opposed to each other is sufficiently larger than the area of the second region where the floating gate electrode and the channel region are opposed to each other, whereby the potential of the floating gate electrode can be set at a required potential when information is written in the floating gate electrode and information is erased from the floating gate electrode. According to the present invention, even with the control gate buried in the semiconductor substrate, information can be written into the floating gate electrode and information can be erased from the floating gate electrode without failure.

According to the present invention, the film thickness of the gate insulation film of the select transistor is relatively large, whereby the select transistor can have the voltage resistance improved. Accordingly, the semiconductor device according to the present embodiment can have high reliability. On the other hand, the film thickness of the gate insulation film between the channel region and the floating gate electrode is set relatively small, whereby the carriers can be caused to tunnel the gate insulation film without failure when information is written in the floating gate electrode and information is erased from the floating gate electrode.

According to the present embodiment, the film thickness of the gate insulation film between the control gate and the floating gate electrode is set relatively large, whereby the carriers accumulated in the floating gate electrode are prevented from leaking. Thus, the semiconductor device according to the present embodiment can have higher reliability.

According to the present invention, the concentration of a dopant implanted in the floating gate electrode is relatively lower, whereby the carriers accumulated in the floating gate electrode can be prevented from leaking through the thinner part of the gate insulation film. The semiconductor device according to the present embodiment can have high reliability.

According to the present invention, the carrier concentration of the edge part of the impurity diffused layer which functions as the source region on the side of the floating gate electrode is set higher, whereby the carriers are caused to tunnel the gate insulation film between the channel region and the floating gate electrode to thereby write information into the floating gate electrode and erase information from the floating gate electrode. On the other hand, the carrier concentration is set lower at the edge part of the impurity diffused layer which functions as the drain region on the side of the floating gate electrode is set lower, whereby the impurity diffused layer which functions as the source region, and the impurity diffused layer which functions as the drain region can be electrically isolated from each other without failure.

BRIEF DESCRIPTION OF THE DRAWINGS

FIGS. 1A and 1B are sectional views of the semiconductor device according to one embodiment of the present invention.

FIGS. 12A and 12B are sectional views of the semiconductor device according to the embodiment of the present invention in the steps of the method for fabricating the semiconductor device, which show the method (Part 8).

DETAILED DESCRIPTION OF THE INVENTION

[One Embodiment]

Figure 2:
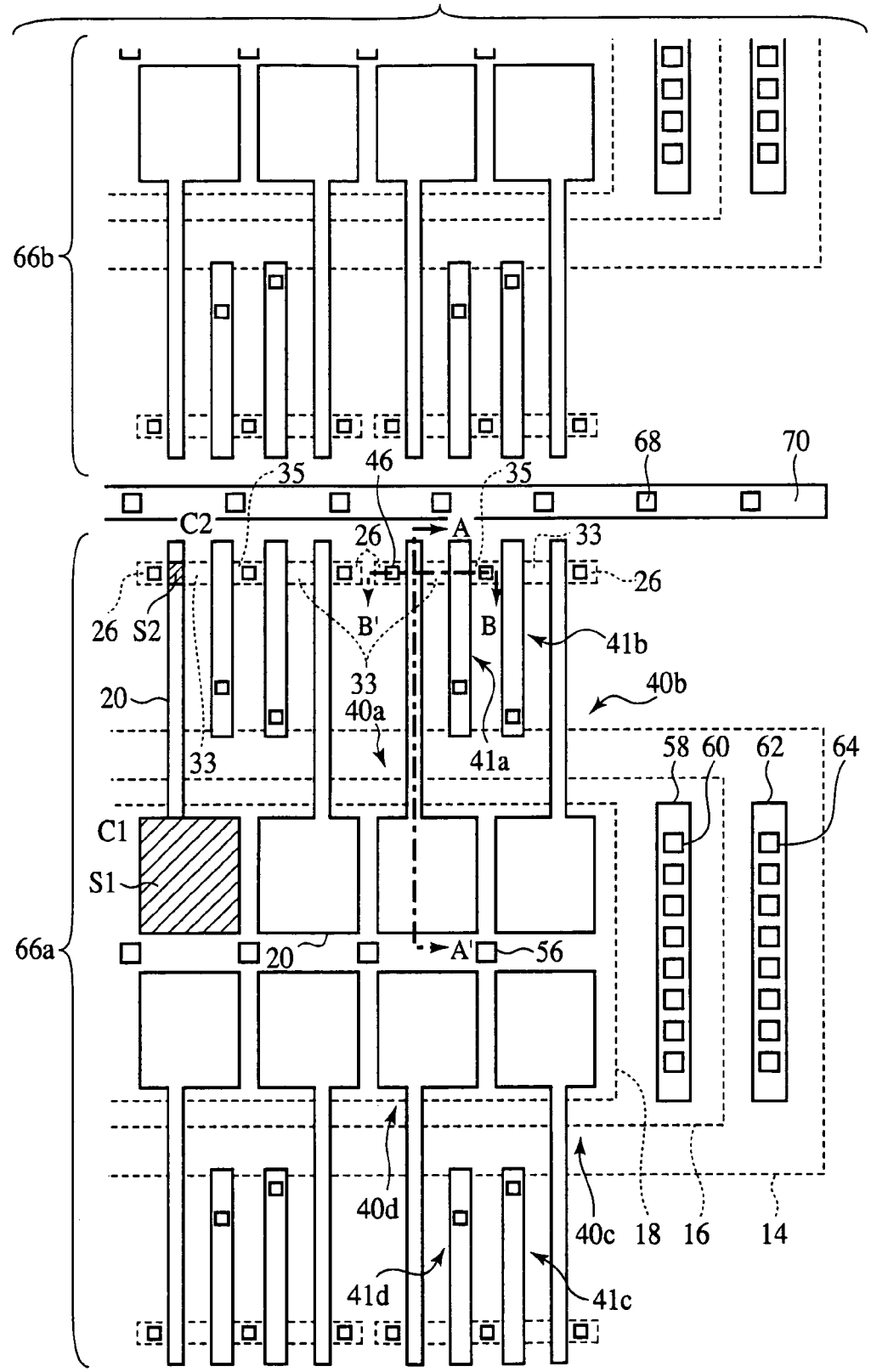
FIG. 2 is a plan view of the semiconductor device according to the embodiment of the present invention.
Figure 3:
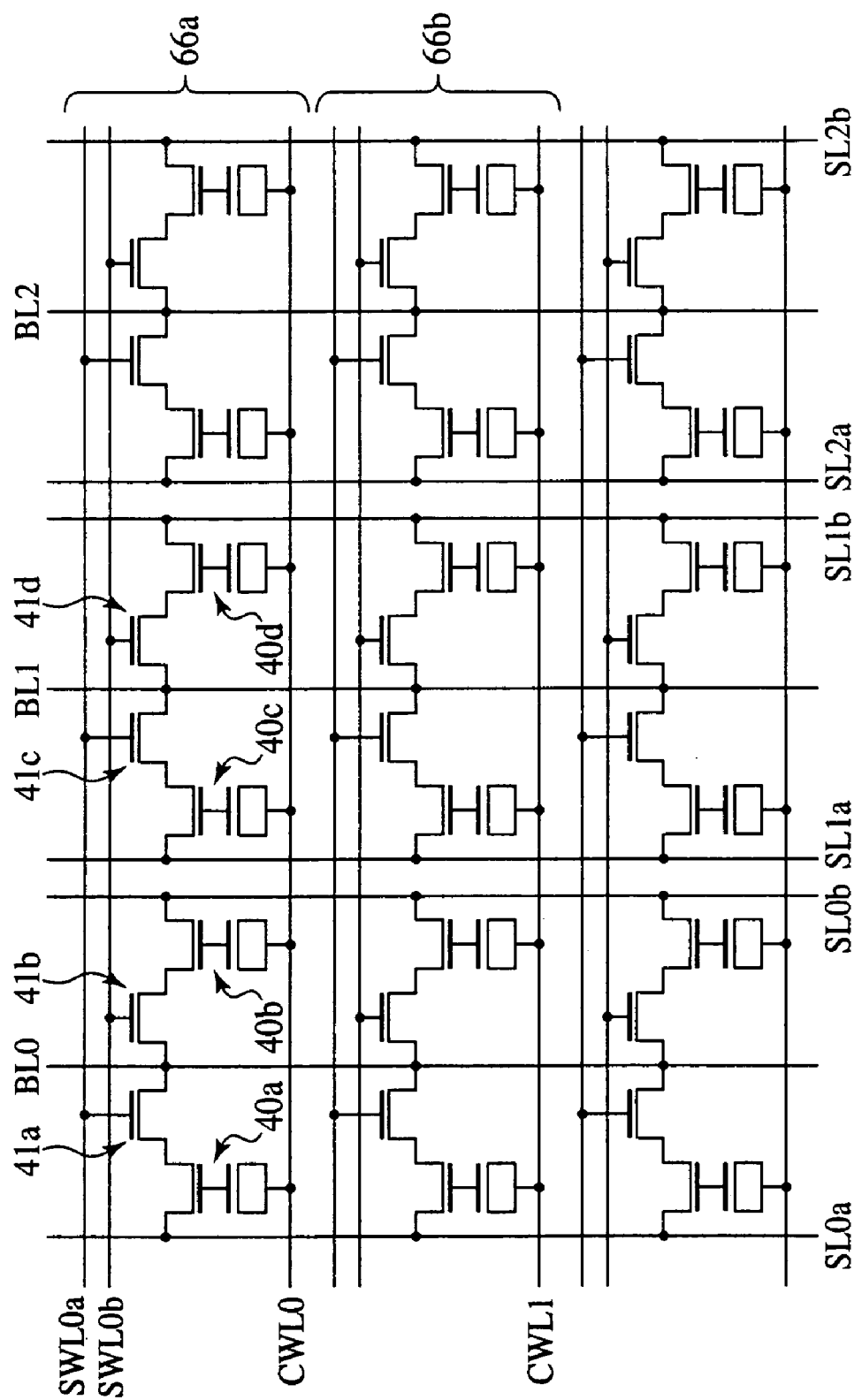
FIG. 3 is a circuit diagram of the semiconductor device according to the embodiment of the present invention.
Figure 4A:
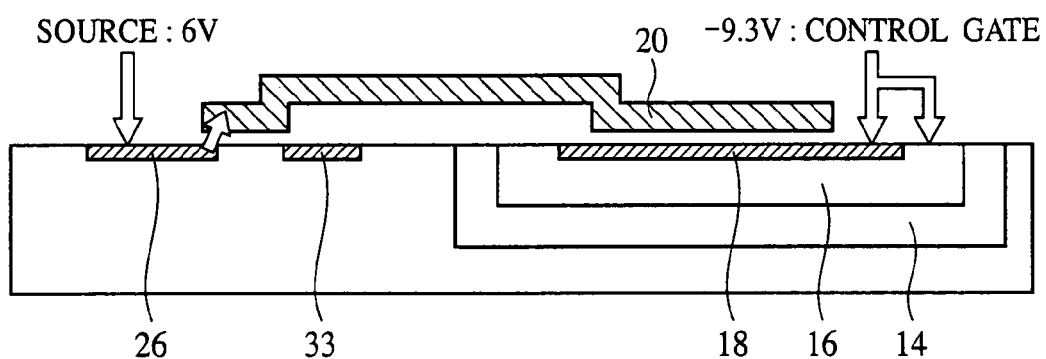
FIGS. 4A and 4B are sectional views of the semiconductor device according to the embodiment of the present invention, which show the operation principle of the semiconductor device.
Figure 4B:
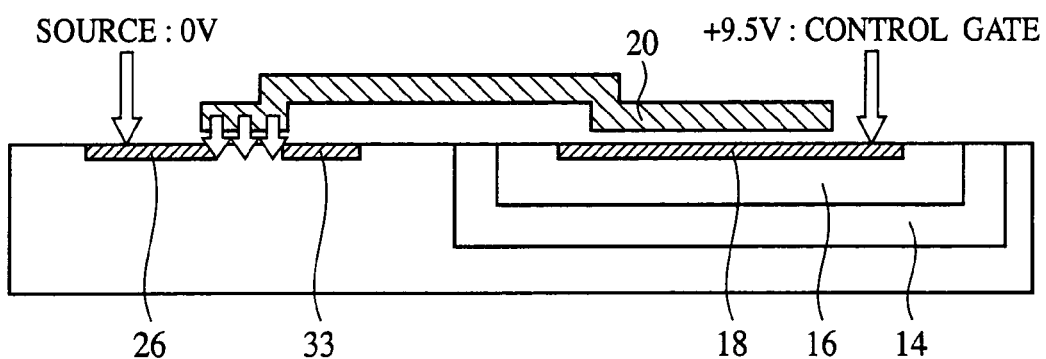

The semiconductor device according to one embodiment of the present invention and the method for fabricating the semiconductor device will be explained with reference to FIGS. 1A to 27. FIGS. 1A and 1B are sectional views of the semiconductor device according to the present embodiment. FIG. 2 is a plan view of the semiconductor device according to the present embodiment. FIG. 1A is the sectional view along the line A–A' in FIG. 2. FIG. 1B is the sectional view along the line B–B' in FIG. 2. FIG. 3 is a circuit diagram of the semiconductor device according to the present embodiment. FIGS. 4A and 4B are sectional views of the semiconductor device according to the present embodiment, which explain the operational principle thereof.

First, the memory transistor of the semiconductor device according to the present embodiment will be explained with reference to FIGS. 1A to 4B.

The region on the left side of the drawing of FIG. 1B is a region 6 where the select transistor is formed, and the region on the right side of the drawing of FIG. 1B is a region 8 where the memory transistor is formed.

As shown in FIG. 1A, device isolation regions 12 for defining device regions are formed on the surface of a semiconductor substrate 10.

In the region on the right side of the drawing of FIG. 1A, an n-type well 14 is formed. The n-type well 14 is formed by implanting an n-type dopant.

In the n-type well 14, a p-type well 16 is formed. The p-type well 16 is formed by implanting a p-type dopant into the n-type well 14.

A control gate 18 is formed in the p-type well 16. The control gate 18 is formed by implanting an n-type dopant into the p-type well 16.

The n-type well 14, the p-type well 16 and the control gate 18 form a triple well. The present embodiment uses such triple well structure for the following reason.

That is, in the present embodiment, as will be described later, when information written in the floating gate electrode 20 is erased, a negative voltage is applied to the control gate 18. However, when a negative voltage is applied simply to the control gate 18, large current flows because the voltage is forward voltage, with the result of the current consumption increase. Then, when a negative voltage is applied to the control gate 18, the same negative voltage is applied to the p-type well 16, whereby the current consumption increase is prevented. In the case that the n-type well 14 is not formed, when a negative voltage is applied simply to the control gate 18 and the p-type well 16, the electric influence is exerted to the rest region. Then, in the present embodiment, the n-type well 14 is formed so as to electrically isolate the semiconductor substrate 10 and the p-type well 16. With the p-type well 16 and the semiconductor substrate 10 isolated from each other by the n-type well 14, information can be written into the floating gate 20 and information can be erased from the floating gate electrode 20 with low current consumption without causing special problems.

A p-type well 22 is formed in the region on the left side of the drawing of FIG. 1A.

A threshold voltage control layer 23 is formed in the semiconductor substrate 10 in the region on the left side of the drawing of FIG. 1A and a region 6 for a select transistor to be formed in (see FIG. 1B). The threshold voltage control layer 23 is formed by implanting a p-type dopant into the semiconductor substrate 10.

A gate insulation film 24 is formed on the semiconductor substrate 10. The gate insulation film 24 is, e.g., a silicon oxide film.

A floating gate electrode 20 is formed on the gate insulation film 24.

The film thickness of the gate insulation film 24 in the region on the left side of the drawing of FIG. 1A, i.e., the film thickness of the gate insulation film 24 present between a channel region 25 and the floating gate electrode 20 is to be relatively thin, e.g., at about 10 nm. The film thickness of the gate insulation film 24 between the channel region 25 and the floating gate electrode 20 is set relatively thin so that carriers are caused to tunnel the gate insulation film 24 between the channel region 25 and the floating gate electrode 20 so as to write information into the floating gate electrode 20 and erase information from the floating gate electrode 20.

The film thickness of the insulation film 24 in the region on the right side of the drawing of FIG. 1A, i.e., between the control gate 18 and the floating gate electrode 20 is set relatively thick, e.g., at about 30 nm. The film thickness of the gate insulation film 24 between the control gate 18 and the floating gate electrode 20 is set relatively thick so that the voltage resistance between the floating gate electrode 20 and the control gate 18 can be sufficiently ensured so as to improve the reliability, and also the carriers accumulated in the floating gate electrode 20 are prevented from leaking through the gate insulation film 24.

The floating gate electrode 20 is formed of doped polysilicon film. A dopant is implanted in the floating gate electrode 20 under conditions that a test piece of polysilicon film of, e.g., a 400 nm-thickness has a resistance value of, e.g., 150 Ω/(square).

The concentration of the dopant implanted in the floating gate electrode 20 is set lower than the concentration of the dopant implanted in the gate electrode 28 of the select transistor. In the present embodiment, the concentration of the dopant implanted in the floating gate electrode 20 is set lower so that the carriers accumulated in the floating gate electrode 20 are prevented from leaking outside through the thin gate insulation film 24. That is, in the case that a high concentration of a dopant is implanted in the floating gate electrode 20, often the gate insulation film 24 does not have sufficient insulation at the thin part, and there is a risk that the carriers accumulated in the floating gate electrode 20 might leak outside the floating gate electrode 20 through the gate insulation film 24. In the present embodiment, the concentration of a dopant to be implanted into the floating gate electrode 20 is set relatively lower, whereby the sufficient insulation of the gate insulation film 24 is ensured, whereby the carriers are prevented from leaking outside the floating gate electrode 20.

An insulation film 30 is formed on the floating gate electrode 20. As a material of the insulation film 30, silicon oxide film, for example, is used. The thickness of the insulation film 30 is, e.g., about 150 nm.

In the present embodiment, the insulation film 30 is formed on the floating gate electrode 20 so that, in forming an impurity diffused layer 26 which functions as the source region, an impurity diffused layer 33 which functions as the drain region, etc., the dopants are prevented from being implanted into the floating gate electrode 20. According to the present embodiment, informing an impurity diffused layer 26 and the impurity diffused layer 33, the dopants are prevented from being implanted into the floating gate electrode 20, which permits the concentration of a dopant to be implanted into the floating gate electrode 20 to be low. Accordingly, the insulation of the gate insulation film 24 can be sufficiently ensured, whereby the carriers accumulated in the floating gate electrode 20 are prevented from leaking through the gate insulation film 24.

As shown in FIG. 1B, an n-type impurity diffused layer 26 is formed in the semiconductor substrate 10 on one side of the floating gate electrode 20. The impurity diffused layer 26 functions as a source region. The impurity diffused layer 26 is formed by implanting a high concentration of a dopant into the semiconductor substrate 10 by self-alignment with the control gate 20. As a dopant, arsenic and phosphorus, for example, are used. The dose of the arsenic is, e.g., $6 \times 10^{15}$ $cm^{-2}$. The dose of the phosphorus is, e.g., $2.5 \times 10^{14}$ $cm^{-2}$. The impurity diffused layer 26 has a high carrier concentration even at the edge part on the side of the floating gate electrode 20, i.e., immediately below the sidewall insulation film 34.

A lightly doped diffused layer 32a is formed in the semiconductor substrate 10 on the other side of the control gate 20 by self-alignment with the floating gate electrode 30.

A sidewall insulation film 34 is formed on the side wall of the floating gate electrode 20.

A heavily doped diffused layer 32b is formed in the semiconductor substrate 10 on the other side of the control gate 20 by self-alignment with the floating gate electrode 20 with the sidewall insulation film 34 formed on. The lightly doped diffused layer 32a and the heavily doped diffused layer 32b constitute an impurity diffused layer 33 which functions as the drain region. The impurity diffused layer 33, which functions as the drain, has a lower carrier concentration in the edge part on the side of the floating gate electrode 30, i.e., immediately below the sidewall insulation film 34.

The impurity diffused layer 26 of a higher carrier concentration has the edge part adjacent to the floating gate electrode 20 so that the carriers are caused to tunnel the gate insulation film 24 between the impurity diffused layer 26, which functions as the source region, and the floating gate electrode 20, whereby information is written into the floating gate electrode 24 and information is erased from the floating gate electrode 24.

On the other hand, the heavily doped diffused layer 32b is spaced from the floating gate electrode 20 so that the impurity diffused layer 33, which functions as the drain region, and the impurity diffused layer 26, which functions as the source region, are electrically isolated without failure.

The memory transistor 40 is thus constituted.

As shown on the left side of the drawing of FIG. 1B, a gate electrode 28 is formed on the semiconductor substrate 10 with a gate insulation film 24 formed therebetween. The thickness of the gate insulation film 24 between the gate electrode 28 and the semiconductor substrate 10 is relatively large, e.g., about 30 nm. The thickness of the gate insulation film 24 between the gate electrode 28 and the semiconductor substrate 10 is set relatively large so that the voltage resistance can be sufficiently ensured to thereby increase the reliability. The gate electrode 28 and the floating gate electrode 20 are formed by patterning one and the same polysilicon film. A dopant is implanted in the gate electrode 28. The dopant is, e.g., phosphorus. The dose of the phosphorus is, e.g., about $6 \times 10^{15}$ $cm^{-2}$. The dopant is implanted in the gate electrode 28 with a relatively high concentration so that the resistance of the gate electrode 28 is decreased for high operational speed.

The lightly doped diffused layer 32a is formed in the semiconductor substrate 10 on both sides of the gate electrode 28 by self-alignment with the gate electrode 28. The lightly doped diffused layer 32a formed on one side of the gate electrode 28 is formed integral with the light doped diffused layer 32a of the memory transistor 40 described above.

A sidewall insulation film 34 is formed on the side wall of the gate electrode 28.

A heavily doped diffused layer 32b is formed in the semiconductor substrate 10 on both sides of the gate electrode 28 and the sidewall insulation film 34 by self-alignment with the gate electrode 28 with the sidewall insulation film 34 formed on. The lightly doped diffused layer 32a and the heavily doped diffused layer 32b formed on one side of the gate electrode 28 constitute an impurity diffused layer 33 which functions as the source region of the select transistor 41. The lightly doped diffused layer 32a and the heavily doped diffused layer 32b formed on the other side of the gate electrode 28 constitute an impurity diffused layer 34 which functions as the drain region of the select transistor 41.

The select transistor 41 is thus constituted.

An insulation film 36 is formed on the entire surface of the semiconductor substrate 10 with the memory transistor 40 and the select transistor 41 formed on. The material of the insulation film 36 is, e.g., silicon oxide film.

An inter-layer insulation film 38 is formed on the entire surface of the insulation film 36. The material of the inter-layer insulation film 38 is, e.g., BPSG film.

Contact holes 42 are formed in the inter-layer insulation film 38 and the insulation film 36 down to the impurity diffused layers 26, 35.

A barrier metal 44 is formed on the insides of the contact holes 42. The material of the barrier metal 44 is, e.g., titanium nitride.

Contact plugs 46 are buried in the contact holes 42 with the barrier metal 44 formed on the insides. The material of the contact plugs 46 is, e.g., tungsten.

Interconnections 48 are formed on the inter-layer insulation film 38 with the contact plugs 46 buried in. The interconnections 48 are formed of a barrier metal 50, a metal film 52 and a barrier metal 54 the latter on the former in the stated order.

As shown in FIG. 2, the floating gate electrode 20 is wide in the region where the floating gate electrode 20 is opposed to the control gate 18, but in the region where the floating gate electrode 20 is not opposed to the control gate 18, the floating gate electrode 20 is narrow. The floating gate electrode 20 has a larger width in the region where the floating gate electrode 20 is opposed to the control gate 18 so that the opposed area between the control gate 18 and the floating gate electrode 20 can be large.

The area of a first region $S_1$ where the control gate 18 and the floating gate electrode 20 are opposed to each other is larger than the area of a second region $S_2$ where the channel region 25 and the floating gate electrode 20 are opposed to each other. Specifically, the area of the first region $S_1$ is, e.g., 40 or more times as large as the area of the second region $S_2$. Accordingly, the electrostatic capacity $C_1$ between the control gate 18 and the floating gate electrode 20 in the first region $S_1$ is, e.g., 10 or more times as large as the electrostatic capacity $C_2$ between the floating gate electrode 20 and the semiconductor substrate 10 in the second region $S_2$. According to the present embodiment, the electrostatic capacity $C_1$ between the control gate 18 and the floating gate electrode 20 in the first region $S_1$ is set sufficiently large with respect to the electrostatic capacity $C_2$ between the floating gate electrode 20 and the semiconductor substrate 10 in the second region $S_2$, whereby the floating gate electrode 20 can be controlled at a required potential when information is written in the floating gate electrode 20 and information is erased from the floating gate electrode 20.

In the present embodiment, the area of the first region $S_1$ is set at, e.g., 40 or more times as large as the area of the second region $S_2$, but the former is not essentially 40 or more times as large as the latter. That is, the ratio between the area of the first region $S_1$ and the area of the second region $S_2$ is suitably set so that the voltage of the floating gate electrode 20 can be set at a required voltage, when information is written in the floating gate electrode 20 and information is erased from the floating gate electrode 20. Specifically, the area of the first region $S_1$ is set at, e.g., 10 or more times as large as the area of the second region $S_2$, whereby the floating gate electrode 20 can be set at a required potential when information is written in the floating gate electrode 20 and information is erased from the floating gate electrode 20.

As seen in FIG. 2, the control gates 18 of a plurality of memory transistors 40 are formed integral. In other words, one control gate 18 acts as the control gates of a plurality of memory transistors 40. In the present embodiment, the control gates 18 of a plurality of memory transistors 40 are formed integral so as to save space and resultantly to realize chip area reduction.

A contact plug 56 for connecting the control gates 18 and on interconnection (not shown) is buried in the inter-layer insulation film 38 (refer to FIGS. 1A and 1B). In the present embodiment, the contact plug 56 for connecting the control gates 18 and the interconnection is common. According to the present embodiment, it is not necessary that a plurality of the control gates 18 have the respective contact plugs 56, which contributes to more space saving.

As seen in FIG. 2, the control gate 18 is formed integral in the single p-type well 16, and the p-type well 16 is formed in one single n-type well 14. This can save more space in comparison with the case that the p-type well 16 and the n-type well 14 are formed for each of a plurality of control gates 18.

A contact plug 60 is buried in the inter-layer insulation film 38 (refer to FIGS. 1A and 1B) for connecting the p-type well 16 to an interconnection 58 formed on the inter-layer insulation film 38. In the present embodiment, the contact plug for interconnecting the p-type well 16 and the interconnection 58 is common. A contact plug 64 is buried in the inter-layer insulation film 38 (refer to FIGS. 1A and 1B) for interconnecting the n-type well 14 and an interconnection 62 formed on the inter-layer insulation film 38. The contact plug 64 for interconnecting the n-type well 14 and the interconnection 62 is common. According to the present embodiment, it is not necessary to form the contact plugs 60, 64 for each of a plurality of p-type wells 16 and a plurality of n-type wells 14. This can save more space.

As shown in FIGS. 2 and 3, a transistor array 66a including a plurality of memory transistors 40, and a transistor array 66b including a plurality of memory transistors 40 are arranged symmetrical.

The memory transistors 40a–40d and the select transistors 41a–41d shown in FIG. 2 are connected to the respective signal line as shown in FIG. 3. In FIG. 3, SWL represents select word lines, CWL represents control word lines, SL represents source lines, and BL represents bit lines.

A contact plug 68 for grounding the semiconductor substrate 10 is buried in the inter-layer insulation film 38 (refer to FIGS. 1A and 1B) in the region between the transistor array 66a and the transistor array 66b. The semiconductor substrate 10 is grounded through the contact plug 68 and the interconnection 70. In the present embodiment, the grounding contact plug 68 is formed between the transistor array 66a and the transistor array 66b so that the noise resistance can be improved. According to the present embodiment, the transistor array 66a and the transistor array 66b are arranged symmetrical, and furthermore, the grounding contact plug 68 is formed between the transistor array 66a and the transistor array 66b, whereby the semiconductor device can have high noise resistance and high reliability.

The contact plug 68 functions as the contact plug for the semiconductor substrate 10 on the side where the transistor array 66a is formed and the contact plug for ground the semiconductor substrate 10 on the side where the transistor array 66b is formed. According to the present embodiment, it is not necessary to form the contact plug 68 for each of the transistor arrays, which can save more space and resultantly contribute to chip area reduction.

The semiconductor device according to the present embodiment is thus constituted.

(Operational Method of the Semiconductor Device)

Next, the operational method of the semiconductor device according to the present embodiment will be explained with reference to FIGS. 4A and 4B. FIG. 4A is a conceptual view of erasing information stored in the floating gate electrode 20. FIG. 4B is a conceptual view of writing information in the floating gate 20.

When information stored in the floating gate electrode 20 is erased, as shown in FIG. 4A, +6 V, for example, is applied to the impurity diffused layer 26, which functions as the source region while –9.3 V, for example, is applied to the control gate 18 and the p-type well 16. Then, the carriers tunnel the gate insulation film 24 between the impurity diffused layer 26, which functions as the source region, and the floating gate electrode 20. Specifically, positive holes are injected from the impurity diffused layer 26, which functions as the source region into the floating gate electrode 20.

Thus, information stored in the floating ate electrode 20 is erased.

On the other hand, when information is written in the floating gate electrode 20, as shown in FIG. 4B, 0 V is applied to the impurity diffused layer 26, which functions as the source region while +9.5 V is applied to the control gate 18. Then, the carriers tunnel the gate insulation film 24 between the impurity diffused layer 26, which functions as the source region and the floating gate electrode 20. Specifically, positive holes are discharged into the impurity diffused layer 26 out of the floating gate electrode 20.

Thus, information is written in the floating gate electrode 20.

As described above, the semiconductor device according to the present embodiment is characterized mainly in that the control gate 18 is buried in the semiconductor substrate 10.

In the conventional semiconductor device, the control gate 218 is stacked on the floating gate electrode 220, forming a flash memory, i.e., the memory transistor 240. Accordingly, it is difficult to form by the same fabrication process the memory transistors 240, and logic transistors, peripheral circuit transistors, etc. Accordingly, hybridization of the memory transistors 240 and the other transistors increases the fabrication processes, which makes the cost reduction difficult.

In contrast to this, according to the present embodiment, the control gate 18 is buried in the semiconductor substrate 10, which makes it unnecessary to form the control gate on the floating gate electrode 20. Thus, according to the present embodiment, it is possible to form the memory transistors 40, the other transistors 41, etc. by the same fabrication process. Resultantly, according to the present embodiment, the fabrication processes can be less, and the semiconductor device can be inexpensive.

As described above, the semiconductor device according to the present embodiment is also characterized mainly in that, the p-type well 16 is formed in the n-type well 14 formed in the semiconductor substrate 10, and the n-type control gate 18 is formed in the p-type well 16, i.e., the so-called triple well structure.

As described above, when information written in the floating gate electrode 20 is erased, negative voltage is applied to the control gate 18. However, when negative voltage is simply applied to the control gate 18, the negative voltage is forward voltage, and large current flows. Accordingly, when negative voltage is applied to the control gate 18, the same negative voltage is applied to the p-type well 16, whereby the consumption current increase is prevented. However, without the n-type well 14 formed, when negative voltage is simply applied to the control gate 18 and the p-type well 16, the other region is electrically influenced. The semiconductor substrate 10 and the p-type well 16 are electrically isolated from each other by the n-type well 14, whereby the other region is kept from being electrically influenced. As described above, according to the present embodiment, the triple well structure is formed, i.e., the p-type well 16 is formed in the n-type well 14 formed in the semiconductor substrate 10, and the n-type control gate 18 is formed in the p-type well 16, whereby, even with the control gate 18 buried in the semiconductor substrate 10, no special problem takes place, and the current consumption increase can be prevented.

Such triple well structure is neither disclosed nor suggested anywhere in the Patent Reference 1 and the Patent Reference 2.

As described above, the semiconductor device according to the present embodiment is also characterized mainly in that the carriers are caused to tunnel the gate insulation film 24 between the floating gate electrode 20 and the channel region 25, whereby information is written in the floating gate electrode 20 and information is erased from the floating gate electrode.

In the conventional semiconductor device, when information is written in the floating gate electrode 220, hot carriers are generated in the channel region, and the hot carriers are injected into the floating gate electrode 220. Accordingly, the conventional semiconductor device has large current consumption.

In contrast to this, in the present embodiment, the tunnel current is used in writing and erasing information, which permits information to be written and erased with small current consumption. According to the present embodiment, information can be written and erased by using the tunnel current without generating hot carriers. The semiconductor device according to the present embodiment can have small current consumption.

The technique of realizing small current consumption by utilizing the tunnel current in writing and erasing information is neither disclosed nor suggested in Patent Reference 1 and Patent Reference 2.

As described above, the semiconductor device according to the present embodiment is also characterized mainly in that the area of the first region $S_1$ where the control gate 18 and the floating gate electrode 20 are opposed to each other is larger that the area of the second region $S_2$ where the channel region 25 and the floating gate electrode 20 are opposed to each other.

According to the present embodiment, the area of the first region $S_1$ is set sufficiently larger than the area of the second region $S_2$, whereby the potential of the floating gate electrode 20 can be set at a required potential when information is written in the floating gate electrode 20 and information is erased from the floating gate electrode 20. Thus, according to the present embodiment, even with the control gate 18 buried in the semiconductor substrate 10, information can be written in the floating gate electrode 20 and information can be erased from the floating gate electrode 20 without failure.

As described above, the semiconductor device according to the present embodiment is also characterized mainly in that the film thickness of the gate insulation film 24 of the select transistor 41 is larger than the film thickness of the gate insulation film 24 between the channel region 25 and the floating gate electrode 20.

According to the present embodiment, the film thickness of the gate insulation film 24 of the select transistor 41 is relatively large, whereby the select transistor 41 can have the voltage resistance improved. Accordingly, the semiconductor device according to the present embodiment can have high reliability. On the other hand, the film thickness of the gate insulation film 24 between the channel region 25 and the floating gate electrode 20 is set relatively small, whereby the carriers can be caused to tunnel the gate insulation film 24 without failure when information is written in the floating gate electrode 20 and information is erased from the floating gate electrode 20.

As described above, the semiconductor device according to the present embodiment is also characterized mainly in that the film thickness of the gate insulation film 24 between the control gate 18 and the floating gate electrode 20 is set larger than the film thickness of the gate insulation film between the channel region 25 and the floating gate electrode 20.

According to the present embodiment, the film thickness of the gate insulation film 24 between the control gate 18 and the floating gate electrode 20 is set relatively large, whereby the carriers accumulated in the floating gate electrode 20 are prevented from leaking. Thus, the semiconductor device according to the present embodiment can have higher reliability.

As described above, the semiconductor device according to the present embodiment is also characterized mainly in that the concentration of a dopant implanted in the floating gate electrode 20 is lower than the concentration of a dopant implanted in the other gate electrodes 28, etc.

According to the present embodiment, the concentration of a dopant implanted in the floating gate electrode 20 is relatively lower, whereby the carriers accumulated in the floating gate electrode 20 can be prevented from leaking through the thinner part of the gate insulation film 24. The semiconductor device according to the present embodiment can have high reliability.

The semiconductor device according to the present embodiment is also characterized mainly in that the carrier concentration at the edge part of the impurity diffused layer 26 which functions as the source region on the side of the gate electrode 20 is set higher, and the carrier concentration of the edge part of the impurity diffused layer 33 which functions as the drain region on the side of gate electrode 20 is set lower.

According to the present embodiment, the carrier concentration of the edge part of the impurity diffused layer 26 which functions as the source region on the side of the floating gate electrode is set higher, whereby the carriers are caused to tunnel the gate insulation film 24 between the channel region 25 and the floating gate electrode 20 to thereby write information in the floating gate electrode 20 and erase information from the floating gate electrode 20. On the other hand, the carrier concentration is set lower at the edge part of the impurity diffused layer 33 which functions as the drain region on the side of the floating gate electrode 20 is set lower, whereby the impurity diffused layer 26 which functions as the source region, and the impurity diffused layer 33 which functions as the drain region can be electrically isolated from each other without failure.

(Method for Fabricating the Semiconductor Device)

Next, the method for fabricating the semiconductor device will be explained with reference to FIGS. 5A to 27. FIGS. 5A to 27 are sectional views of the semiconductor device in the steps of the method for fabricating the semiconductor device, which show the method.

Figure 5A:
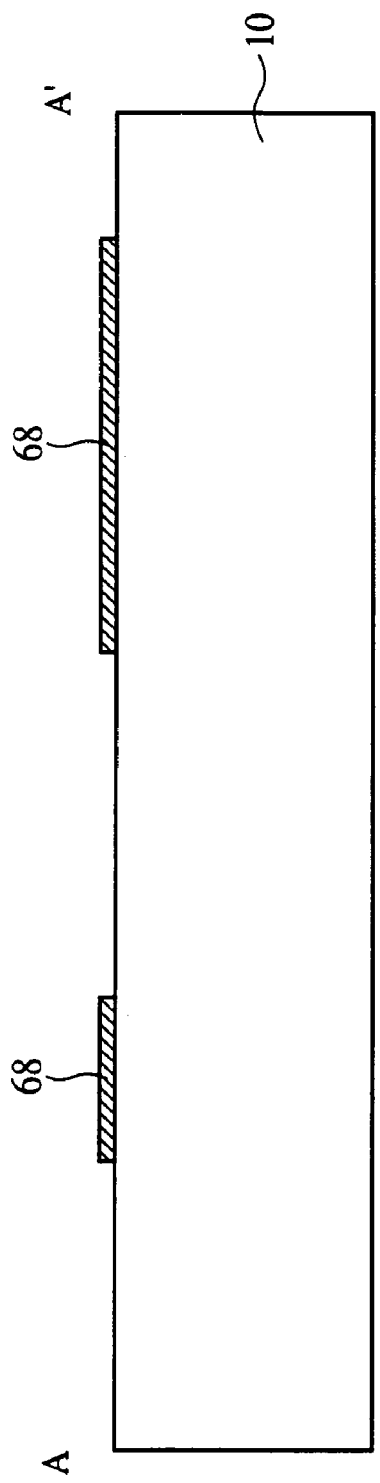
FIGS. 5A and 5B are sectional views of the semiconductor device according to the embodiment of the present invention in the steps of the method for fabricating the semiconductor device, which show the method (Part 1).
Figure 5B:
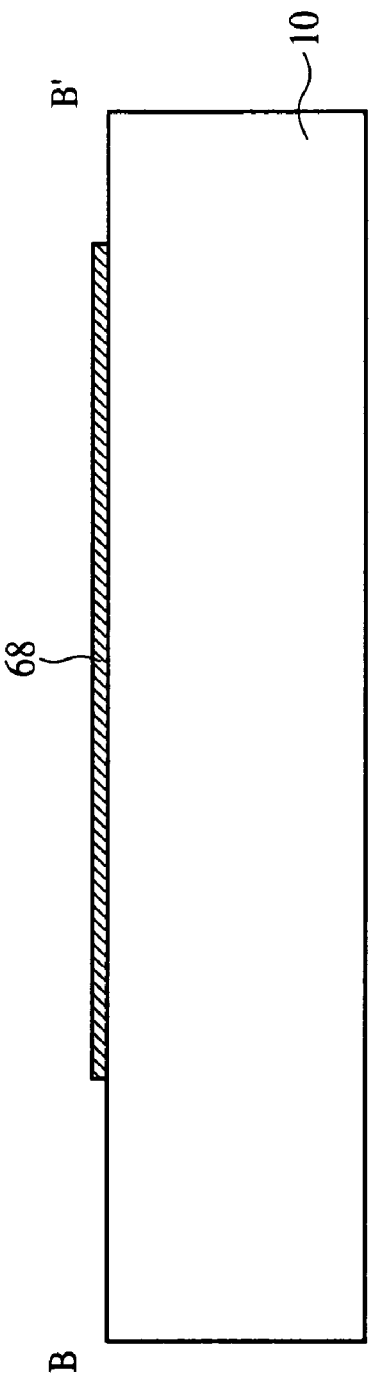

First, as shown in FIGS. 5A and 5B, a silicon nitride film is formed on the semiconductor substrate 10 of, e.g., silicon. The film thickness of the silicon nitride film is, e.g., about 100 nm. Then, the silicon nitride film is patterned by photolithography. Thus, a mask 68 for the silicon nitride film is formed. The mask 68 is for selectively forming the device isolation regions 12 in the step which will be described later.

Figure 6A:
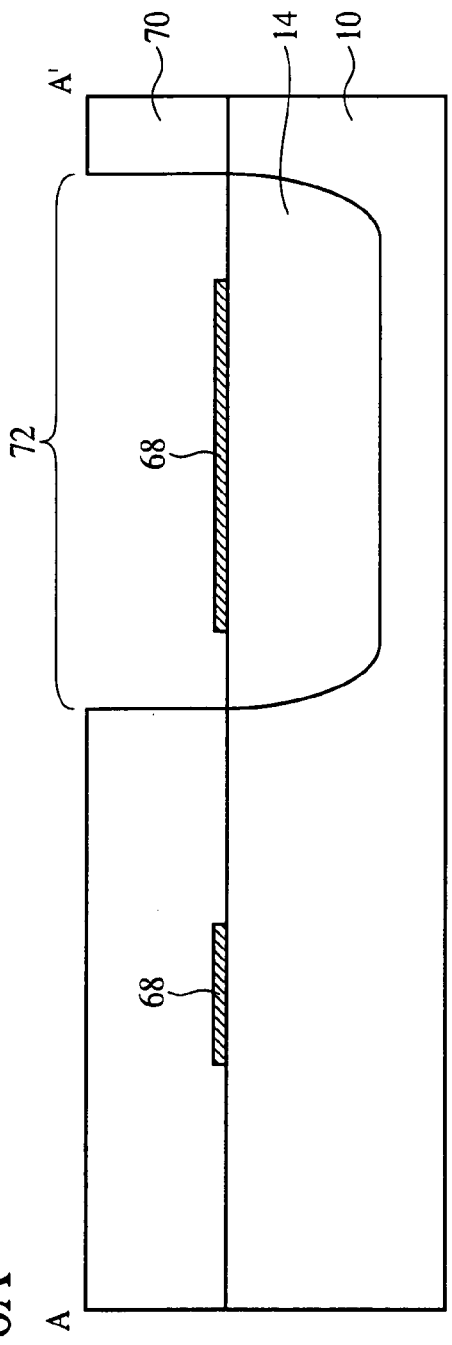
FIGS. 6A and 6B are sectional views of the semiconductor device according to the embodiment of the present invention in the steps of the method for fabricating the semiconductor device, which show the method (Part 2).
Figure 6B:
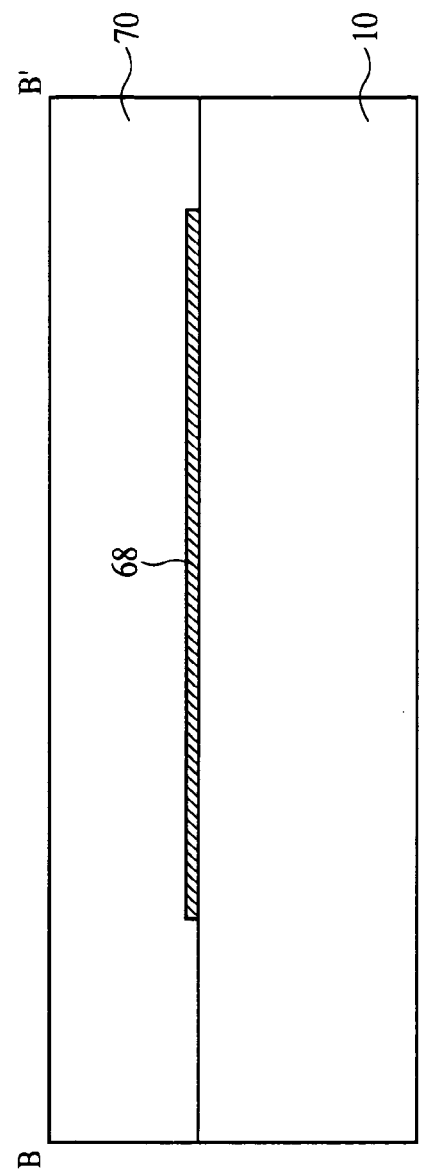

Then, as shown in FIGS. 6A and 6B, a photoresist film 70 is formed on the entire surface by, e.g., spin coating. Then, an opening 72 is formed in the photoresist film 70 down to the semiconductor substrate 10. The opening 72 is for forming the n-type well 14.

Next, with the photoresist film 70 as the mask, an n-type dopant is implanted into the semiconductor substrate 10 by ion implantation. The dopant is, e.g., phosphorus. Conditions for the ion implantation are, e.g., a 180 keV acceleration energy and a $1.65 \times 10^{13}$ cm$^{-2}$ dose. Thus, the n-type well 14 is formed deep in the semiconductor substrate 10. Then, the photoresist film 70 is released.

Figure 7A:
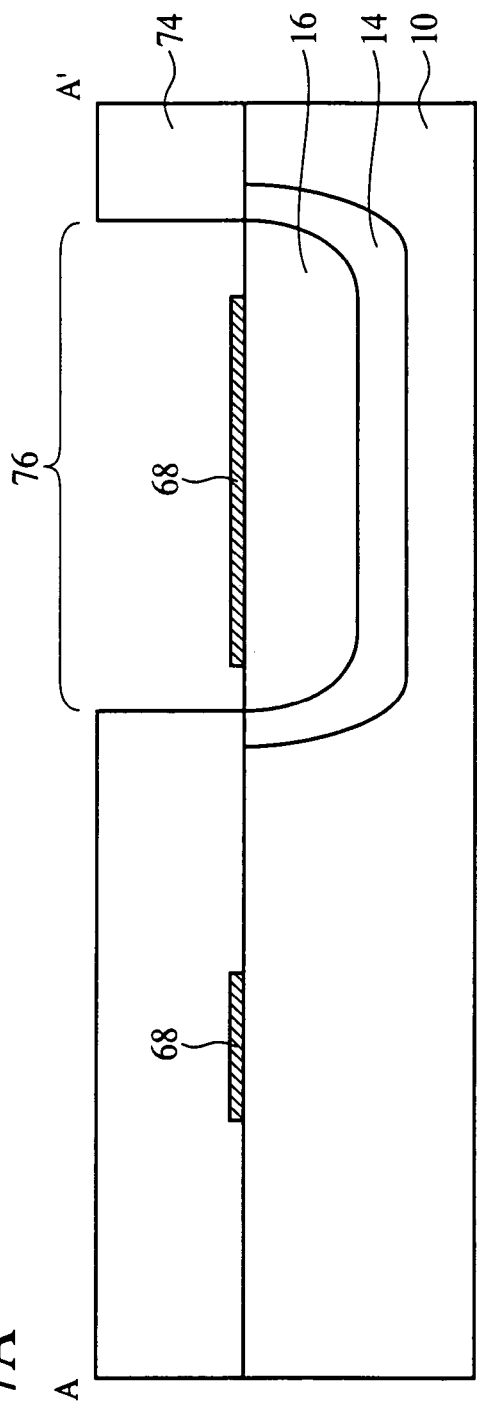
FIGS. 7A and 7B are sectional views of the semiconductor device according to the embodiment of the present invention in the steps of the method for fabricating the semiconductor device, which show the method (Part 3).
Figure 7B:
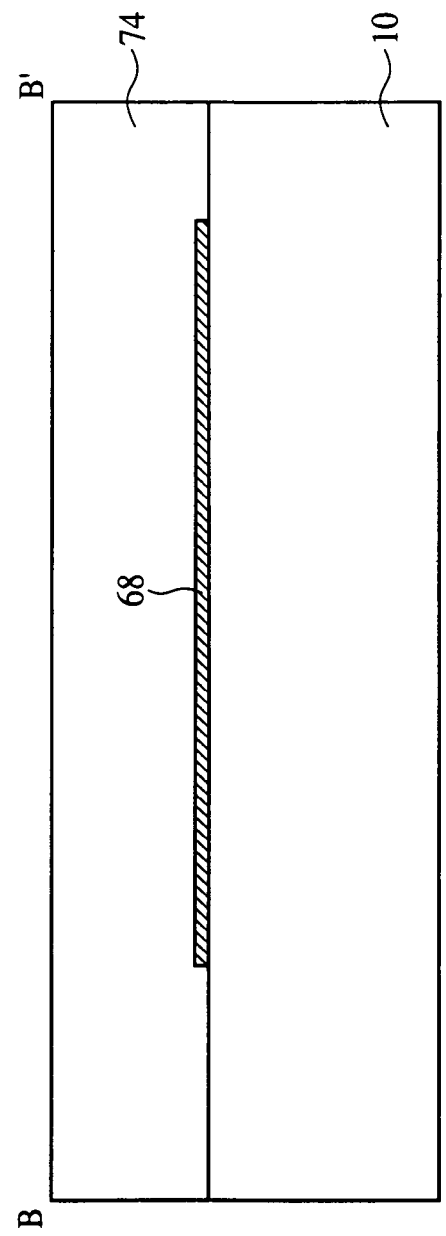

Then, as shown n FIGS. 7A and 7B, a photoresist film 74 is formed on the entire surface by, e.g., spin coating. Then, an opening 76 is formed in the photoresist film 74 down to the semiconductor substrate 10. The opening 76 is for forming the p-type well 16.

Next, with the photoresist film 74 as the mask, a p-type dopant is implanted in the n-type well 14 by, e.g., ion implantation. The dopant is, e.g., boron. Conditions for the ion implantation are, e.g., a 180 keV acceleration energy and a $1.85 \times 10^{13}$ cm$^{-2}$. Thus, the p-type well 16 is formed in then-type well 14. Then, the photoresist film 74 is released.

Figure 8A:
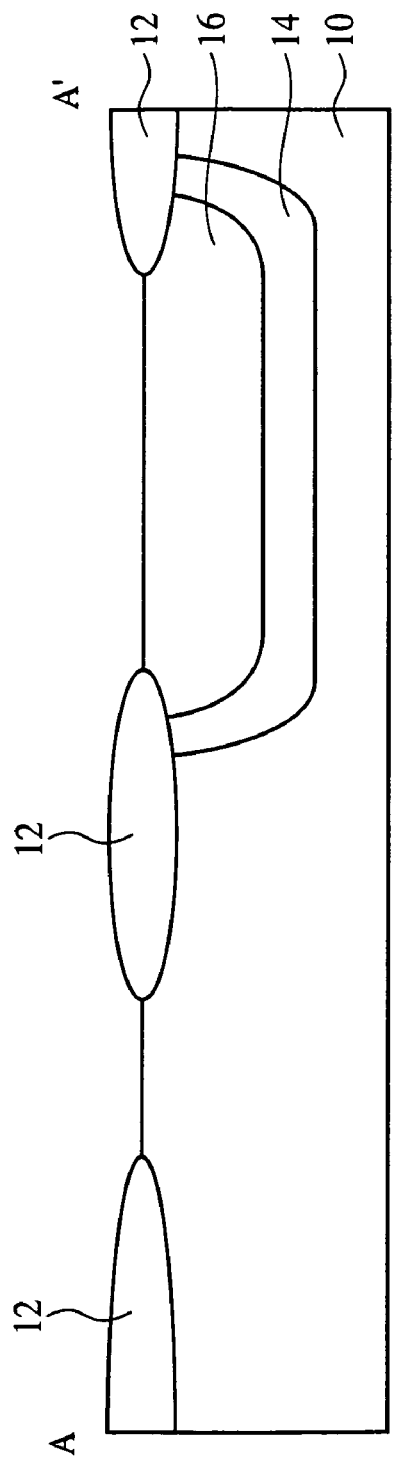
FIGS. 8A and 8B are sectional views of the semiconductor device according to the embodiment of the present invention in the steps of the method for fabricating the semiconductor device, which show the method (Part 4).
Figure 8B:
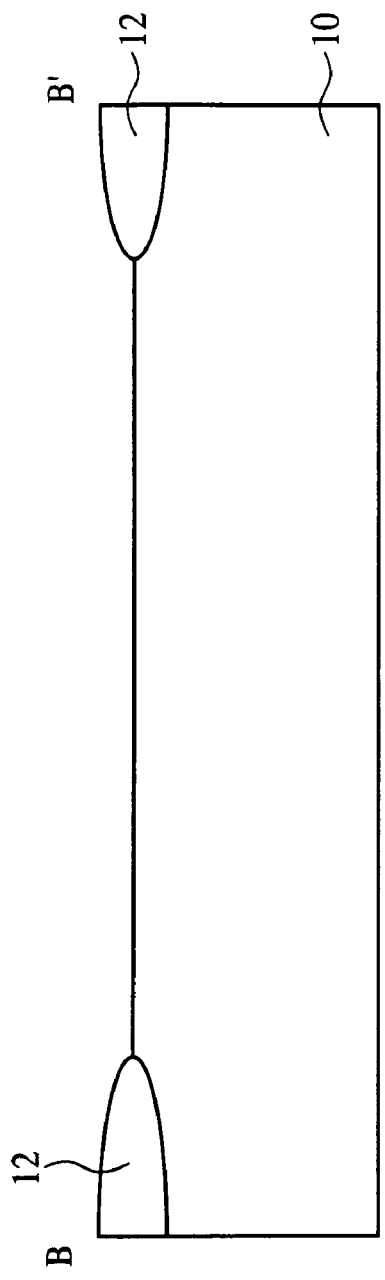

Next, as shown in FIGS. 8A and 8B, device isolation regions 12 are formed by, e.g., LOCOS. Then, the mask 68 is removed by, e.g., wet etching.

Figure 9A:
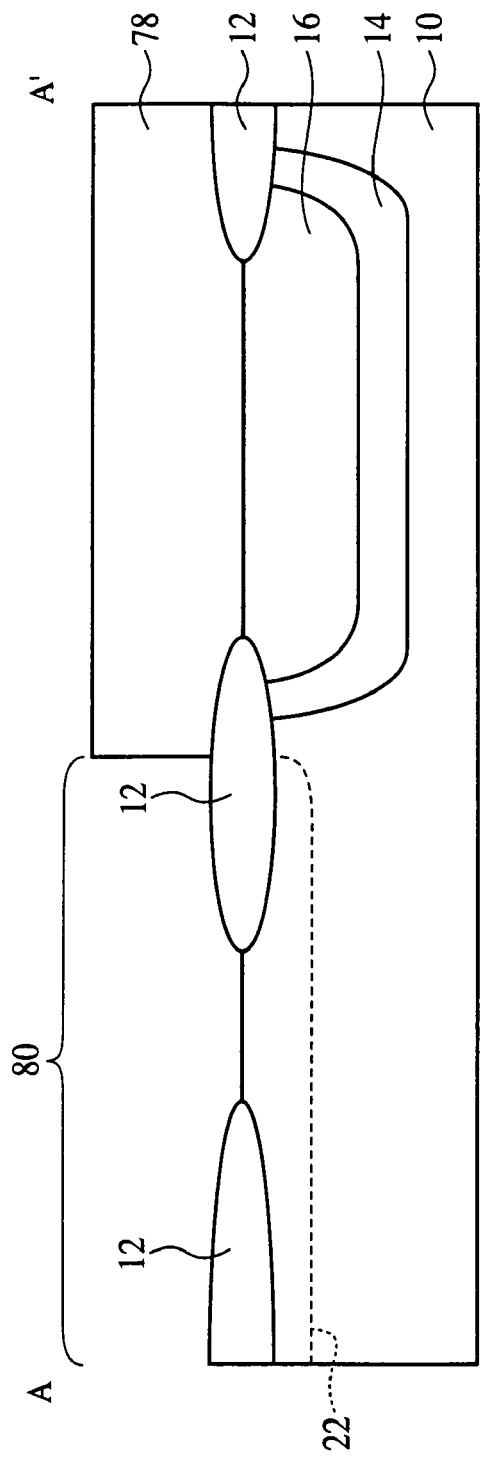
FIGS. 9A and 9B are sectional views of the semiconductor device according to the embodiment of the present invention in the steps of the method for fabricating the semiconductor device, which show the method (Part 5).
Figure 9B:
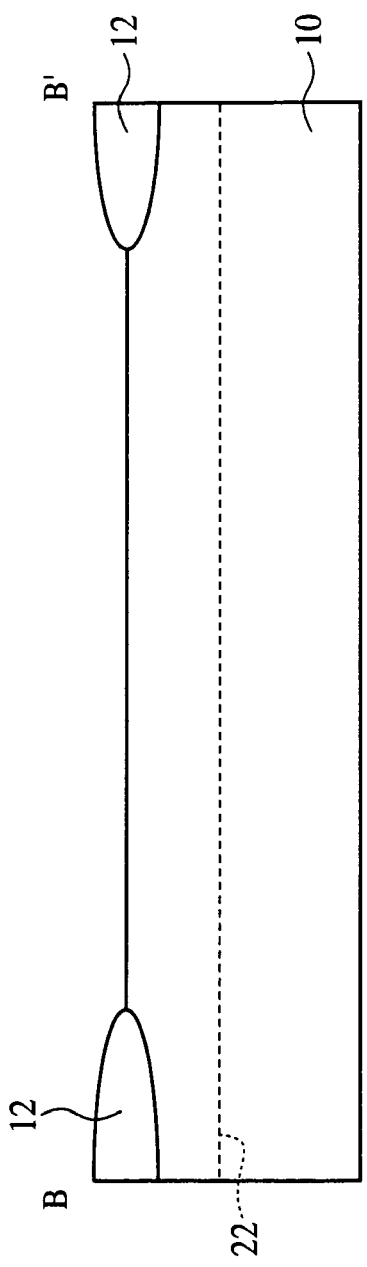

Then, as shown in FIGS. 9A and 9B, a photoresist film 78 is formed on the entire surface by, e.g., spin coating. Next, an opening 80 is formed in the photoresist film 78 down to the semiconductor substrate 10. The opening 80 is for forming the p-type well 22.

Then, with the photoresist film 78 as the mask, a p-type dopant is implanted by, e.g., ion implantation. The dopant is, e.g., boron. Conditions for the ion implantation are, e.g., a 150 keV acceleration energy and a $4.5 \times 10^{12}$ cm$^{-2}$ dose. Thus, the p-type well 22 is formed. Next, the photoresist film 78 is released.

Figure 10A:
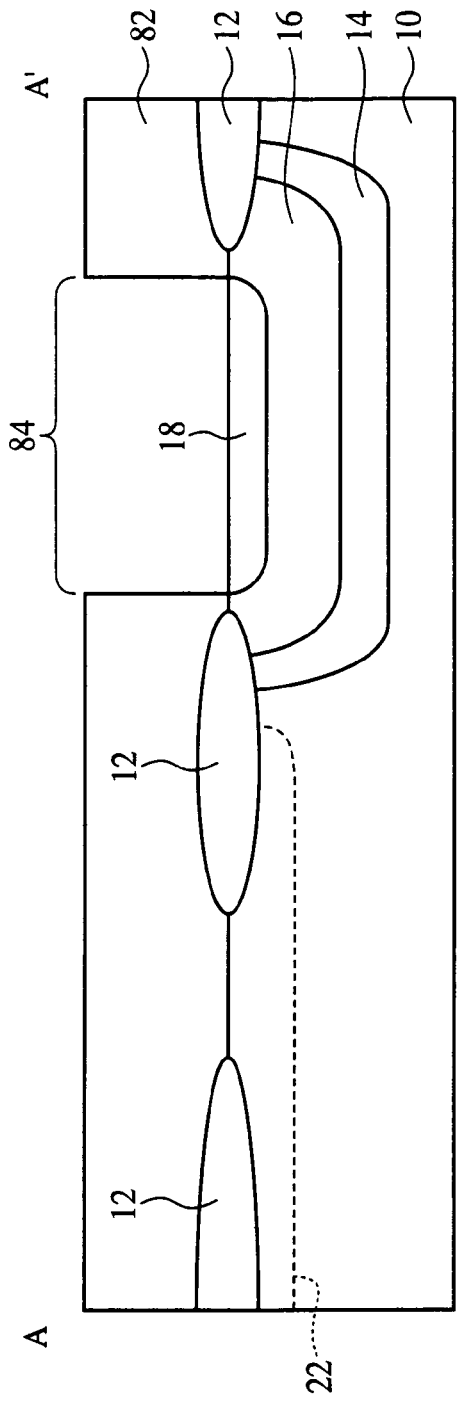
FIGS. 10A and 10B are sectional views of the semiconductor device according to the embodiment of the present invention in the steps of the method for fabricating the semiconductor device, which show the method (Part 6).
Figure 10B:
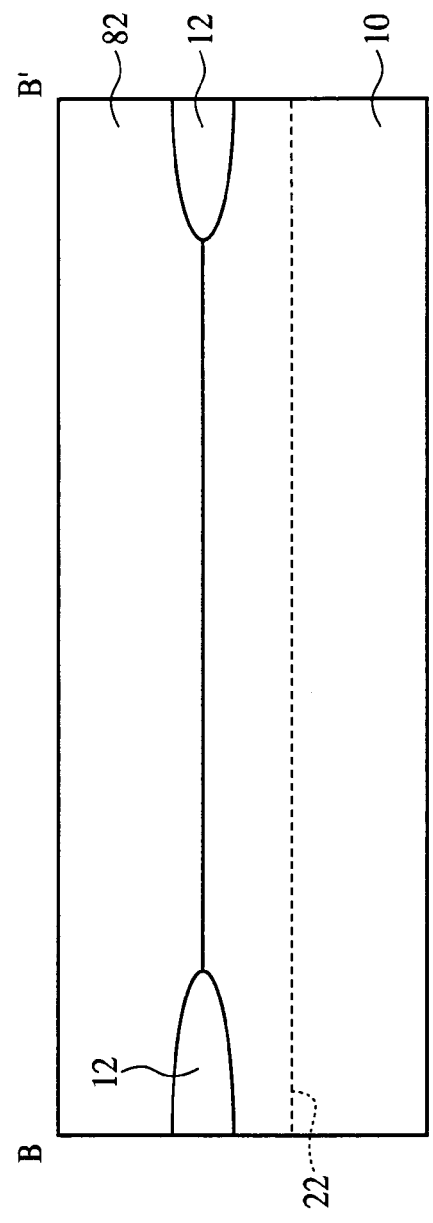

Then, as shown in FIGS. 10A and 10B, a photoresist film 82 is formed on the entire surface by, e.g., spin coating. Next, the an opening 84 is formed in the photoresist film 82 down to the semiconductor substrate 10. The opening 84 is for forming the control gate 18.

Next, with the photoresist film 82 as the mask, a n-type dopant is implanted by, e.g., ion implantation. The dopant is, e.g., arsenic. Conditions for the ion implantation are, e.g., a 80 keV acceleration energy and a $3.5 \times 10^{15}$ cm$^{-2}$ dose. Thus, the control gate is formed of then-type impurity diffused layer. Then, the photoresist film 82 is released.

Figure 11A:
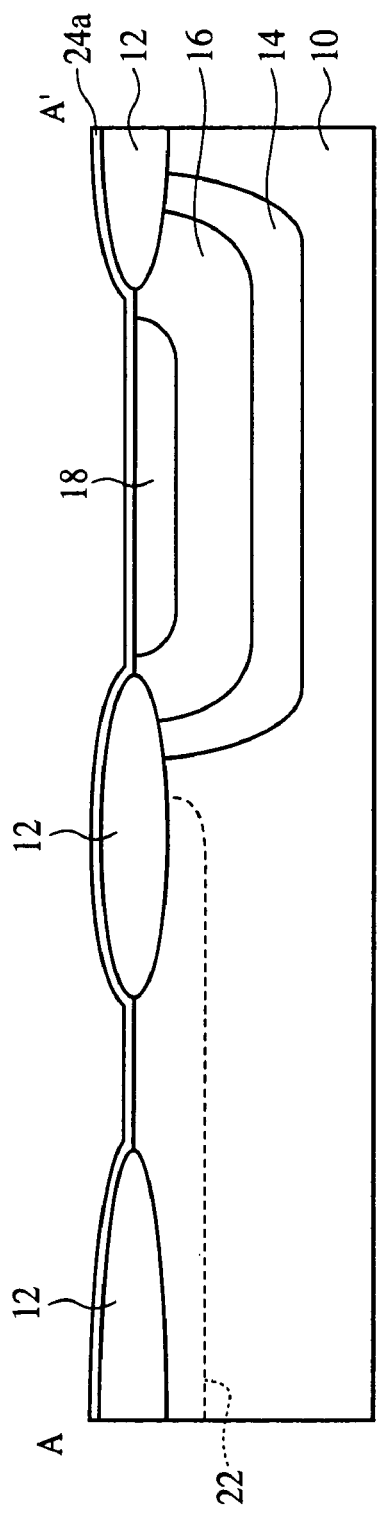
FIGS. 11A and 11B are sectional views of the semiconductor device according to the embodiment of the present invention in the steps of the method for fabricating the semiconductor device, which show the method (Part 7).
Figure 11B:
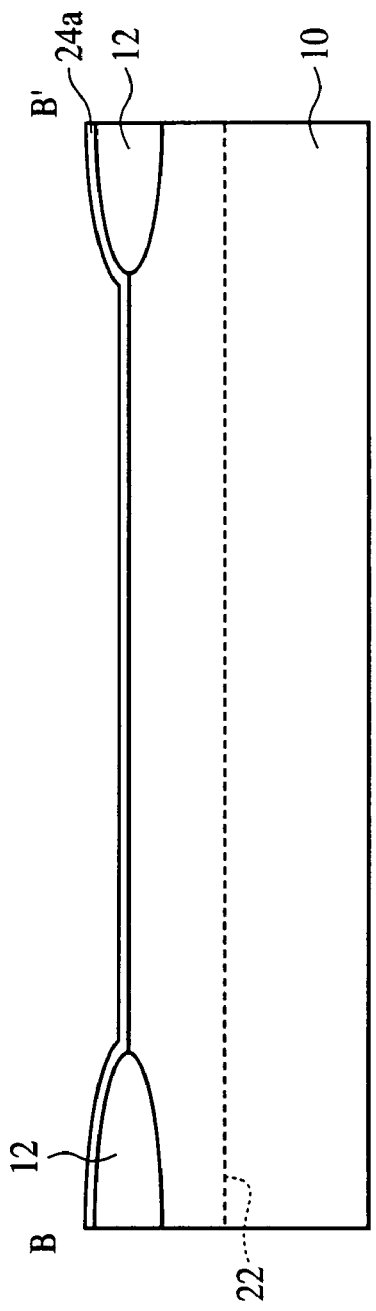

Next, as shown in FIGS. 11A and 11B, the gate insulation film 24a is formed on the entire surface by, e.g., thermal oxidation. The film thickness of the gate insulation film 24a is, e.g., 9 nm. The gate insulation film 24a is formed of, e.g., a silicon oxide film.

Then, as shown in FIGS. 12A and 12B, a photoresist film 86 is formed on the entire surface by, e.g., spin coating. Next, an opening 88 is formed in the photoresist film 86 down to the semiconductor substrate 10.

Next, with the photoresist film 86 as the mask, a gate insulation film 24a is etched off. Then, the photoresist film 86 is released.

Figure 13A:
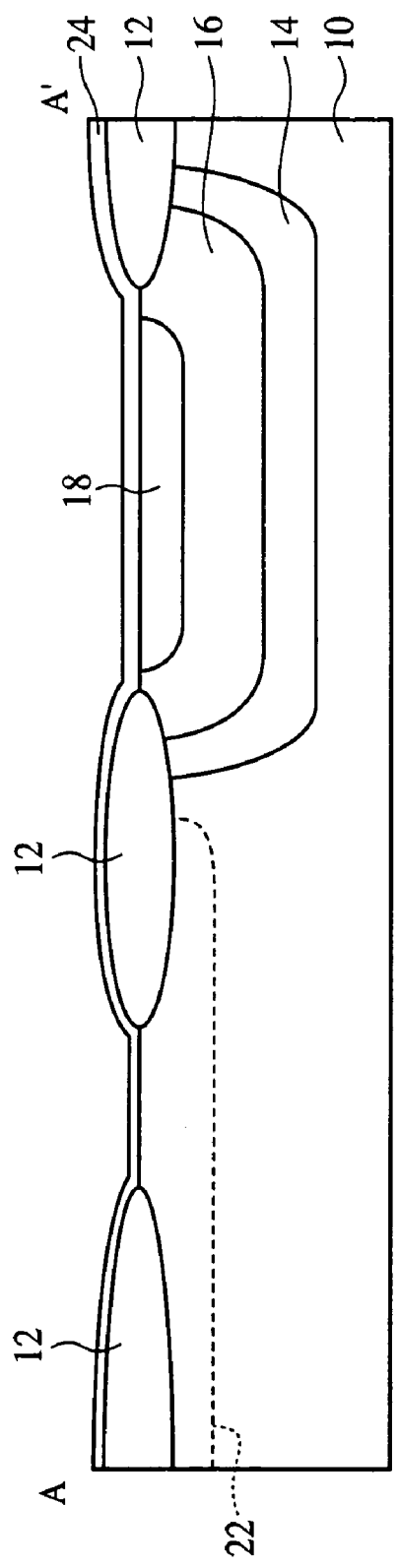
FIGS. 13A and 13B are sectional views of the semiconductor device according to the embodiment of the present invention in the steps of the method for fabricating the semiconductor device, which show the method (Part 9).
Figure 13B:
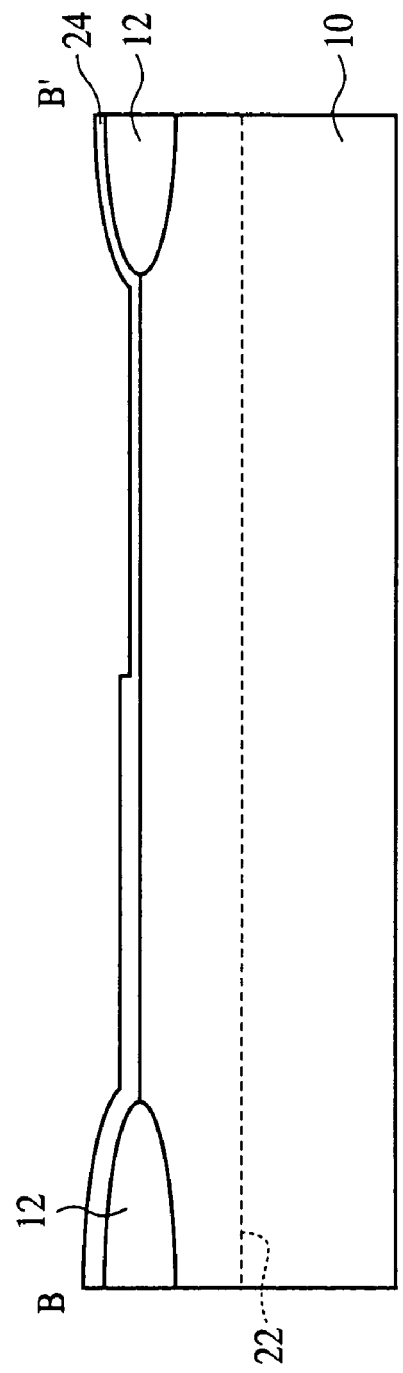

Then, as shown in FIGS. 13A and 13B, the gate insulation film 24 is further formed on the entire surface by, e.g., thermal oxidation. The film thickness of the gate insulation film 24 in the region where the gate insulation film 24a is left is thick, e.g., about 30 nm. On the other hand, in the region where the gate insulation film 24a has been etched off, the film thickness of the gate insulation film 24 is thin, e.g., about 10 nm.

Figure 14A:
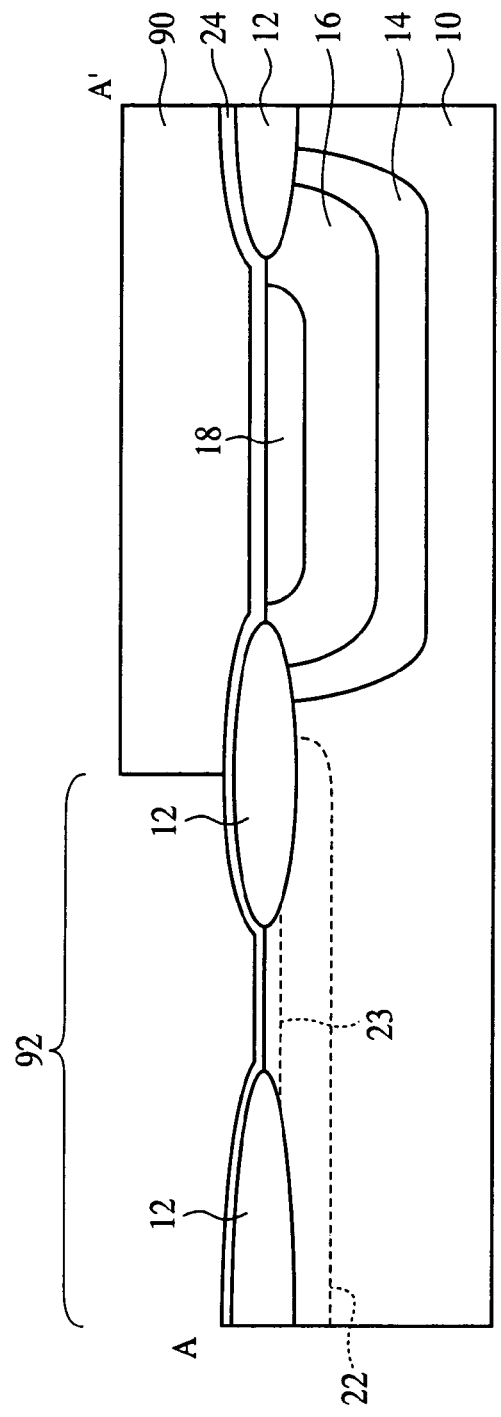
FIGS. 14A and 14B are sectional views of the semiconductor device according to the embodiment of the present invention in the steps of the method for fabricating the semiconductor device, which show the method (Part 10).
Figure 14B:
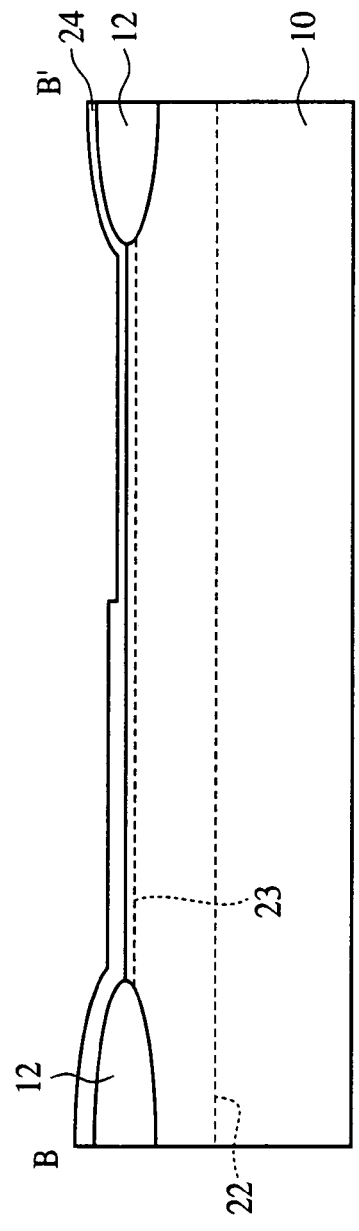

Then, as shown in FIGS. 14A and 14B, a photoresist film 80 is formed on the entire surface by, e.g., spin coating. Next, an opening 92 is opened in the photoresist film 90 down to the semiconductor substrate 10. The opening 92 is for forming the threshold voltage control layer 23.

Next, with the photoresist film 90 as the mask, a p-type dopant is implanted by e.g, ion implantation. The dopant is, e.g., boron. Conditions for the ion implantation are, e.g., a 25 keV acceleration energy and a $1.6 \times 10^{12}$ cm$^{-2}$ dose. Thus, the p-type threshold voltage control layer 23 is formed. Next, the photoresist film 90 is released. In the present embodiment, the threshold voltage control layer 23 of the memory transistor 40 and the threshold voltage control layer 23 of the other transistors 41, etc. are formed by one and the same process by using one and the same photoresist film 90.

Figure 15A:
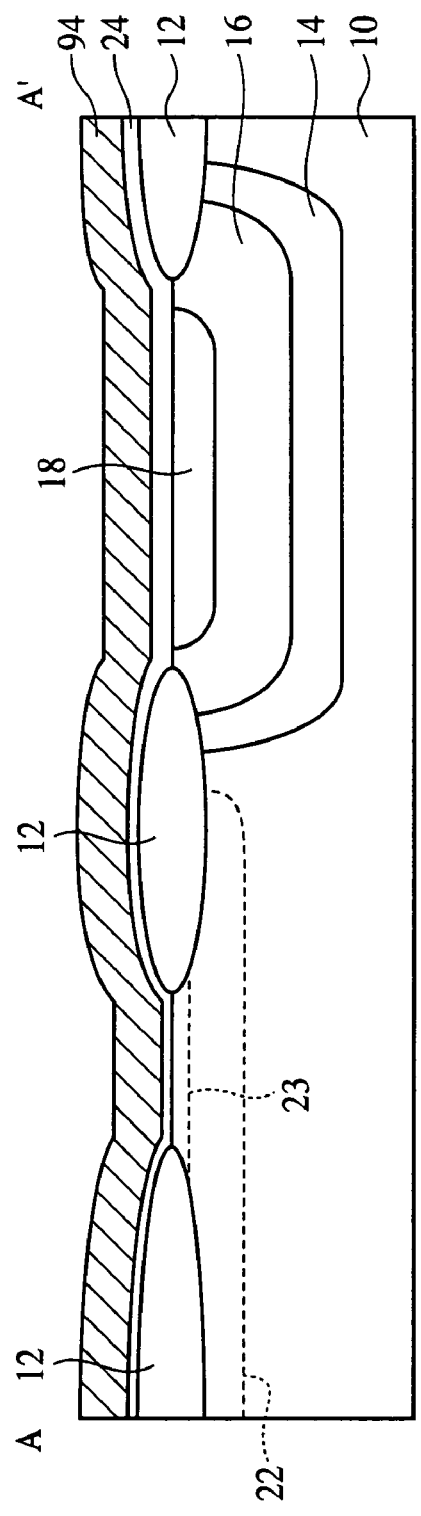
FIGS. 15A and 15B are sectional views of the semiconductor device according to the embodiment of the present invention in the steps of the method for fabricating the semiconductor device, which show the method (Part 11).
Figure 15B:
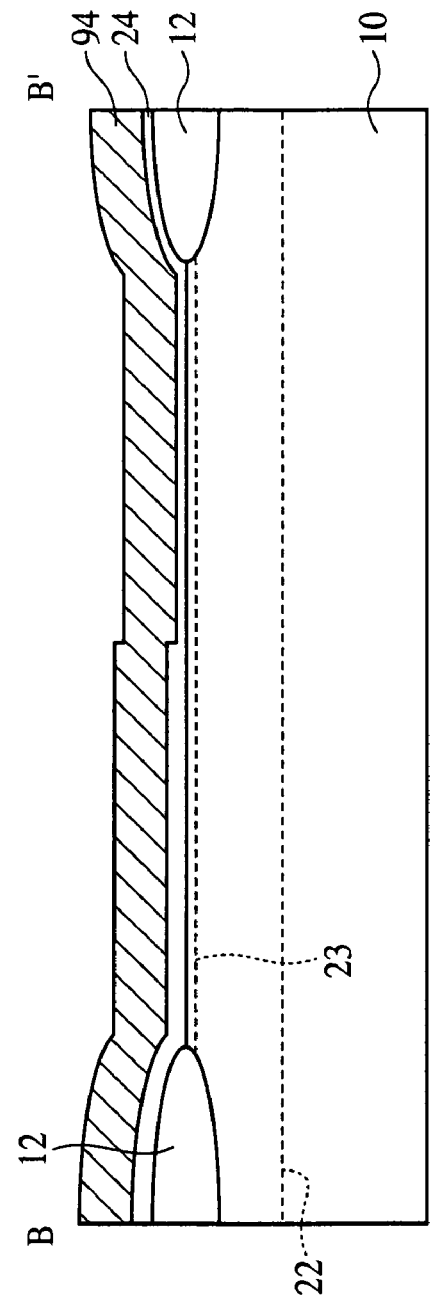

Next, as shown in FIGS. 15A and 15B, the polysilicon film 94 is formed on the entire surface by, e.g., CVD. Then, a relatively low concentration of an n-type dopant is implanted into the polysilicon film 94. At this time, the dopant is implanted into the polysilicon film 94 under conditions which make the resistance valve of a test piece of a polysiliocn film of, e.g., a 400 nm-thickness 150 Ω/(square). The film thickness of the polysilicon film 94 is, e.g., 300 nm.

Figure 16A:
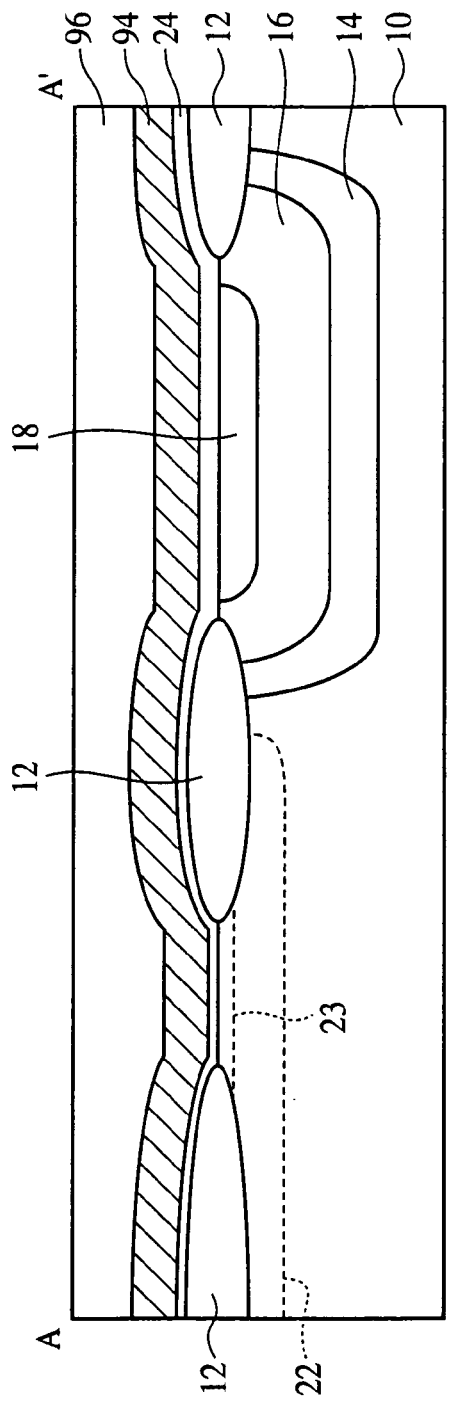
FIGS. 16A and 16B are sectional views of the semiconductor device according to the embodiment of the present invention in the steps of the method for fabricating the semiconductor device, which show the method (Part 12).
Figure 16B:
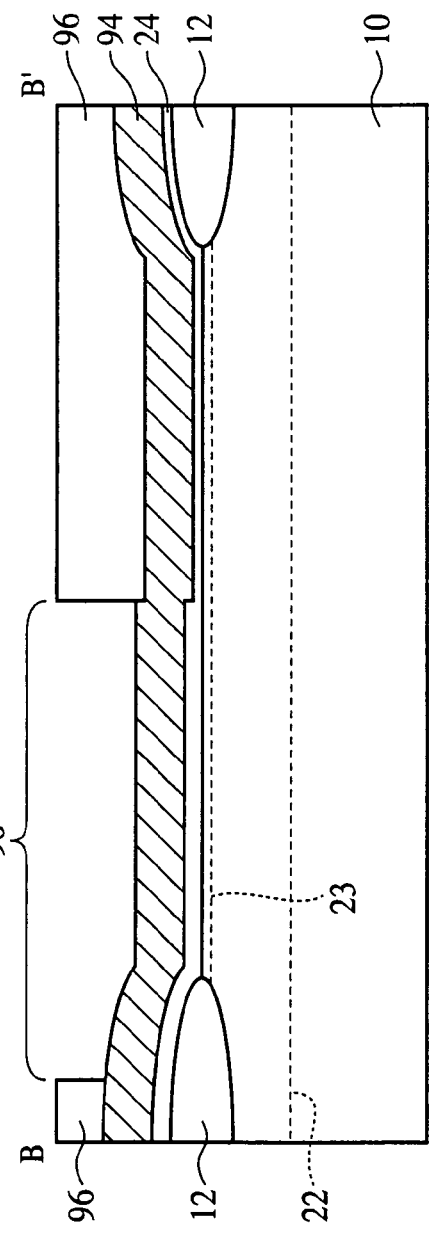

Next, as shown in FIGS. 16A and 16B, a photoresist film 96 is formed on the entire surface by, e.g., spin coating. Then, an opening 98 is formed in the photoresist film 96 down to the polysilicon film 94. The opening 98 is for heavily implanting a dopant into a part of the polysilicon film 94.

Then, with the photoresist film 96 as the mask, an n-type dopant, for example, is heavily implanted into the polysilicon film 94 by, e.g., ion implantation. The dopant is, e.g., phosphorus. The dose of the phosphorus is, e.g., $6 \times 10^{15}$ cm$^{-2}$.

Figure 17A:
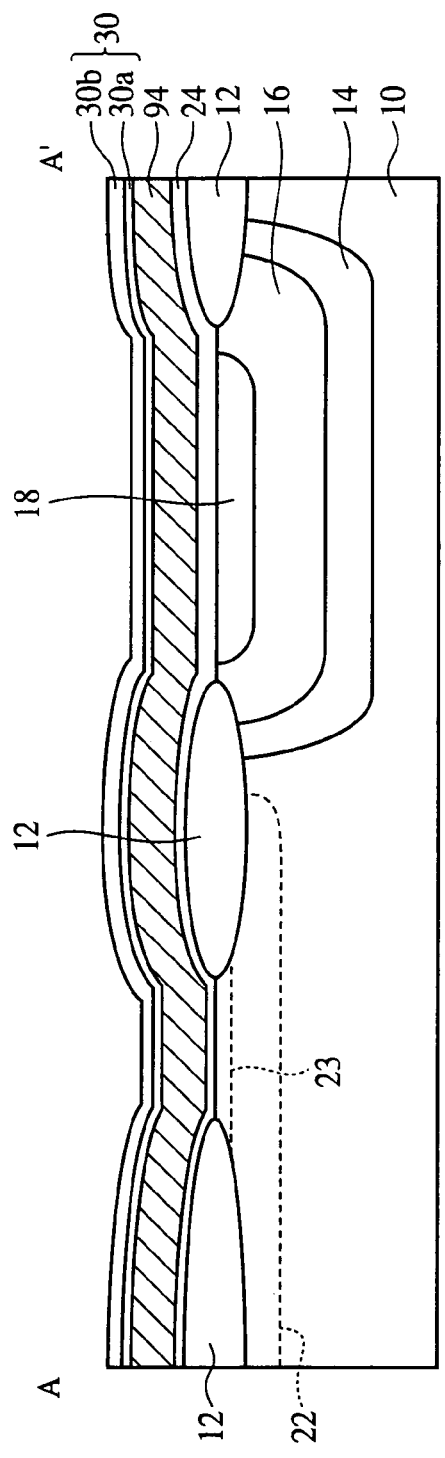
FIGS. 17A and 17B are sectional views of the semiconductor device according to the embodiment of the present invention in the steps of the method for fabricating the semiconductor device, which show the method (Part 13).
Figure 17B:
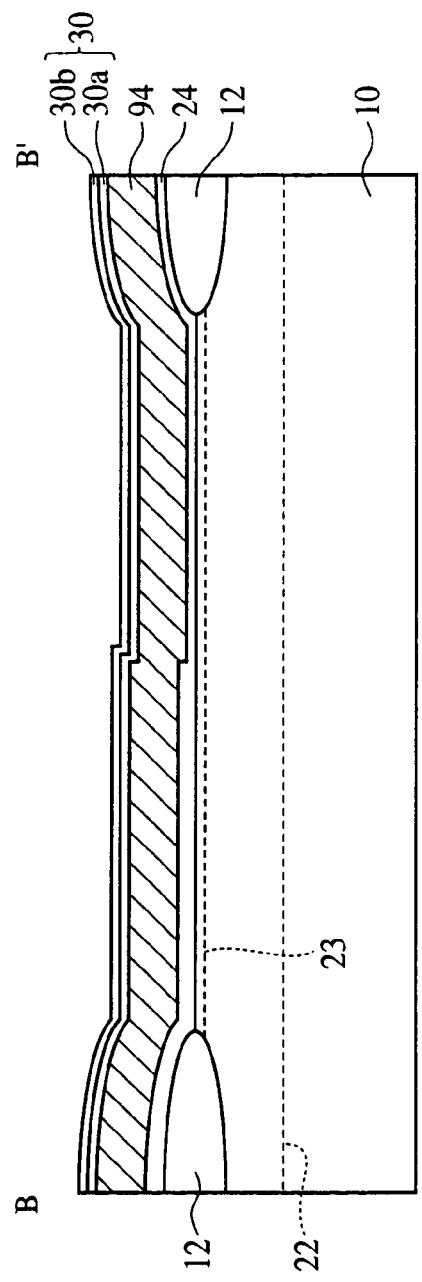

Next, as shown in FIGS. 17A and 17B, a silicon oxide film 30a is formed on the polysilicon film 94 by, e.g., thermal oxidation. The film thickness of the silicon oxide film 30a is, e.g., about 10 nm.

Then, a silicon oxide film 30b is formed on the silicon oxide film 30a by, e.g., CVD. The film thickness of the silicon oxide film 30b is, e.g., about 150 nm. The temperature inside the film forming chamber for forming the silicon oxide film 30b is, e.g., about 800° C. The silicon oxide film 30a and the silicon oxide film 30b constitute the insulation film 30.

The insulation film 30 is formed on the polysilicon film 96 so that, as described above, when the impurity diffused layers 26, 33, 35, etc. are formed in later steps, dopants are prevented from being implanted into the floating gate electrode 20 of the polysilicon film 96.

Figure 18A:
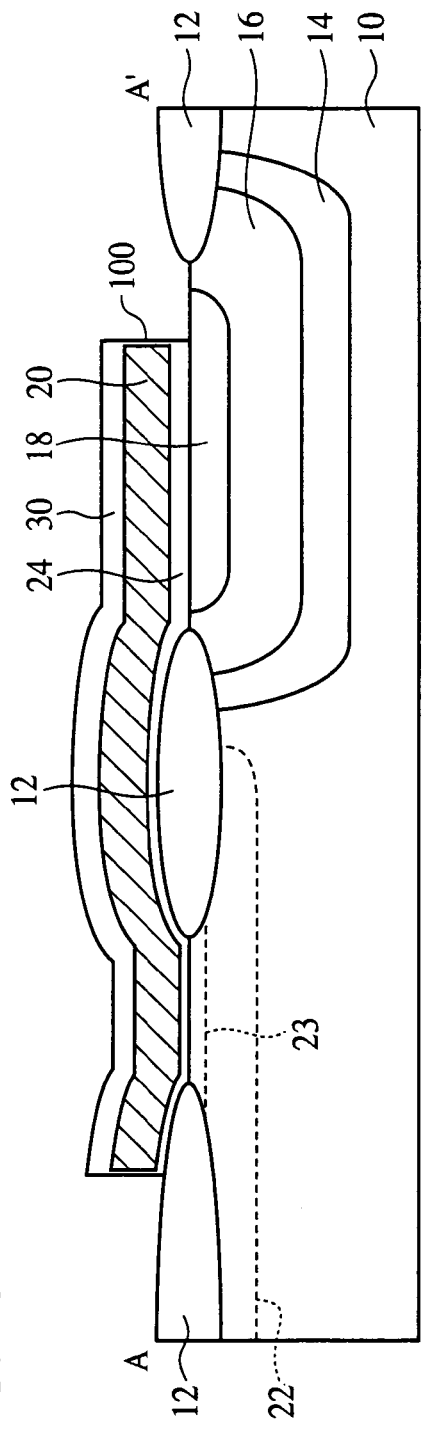
FIGS. 18A and 18B are sectional views of the semiconductor device according to the embodiment of the present invention in the steps of the method for fabricating the semiconductor device, which show the method (Part 14).
Figure 18B:
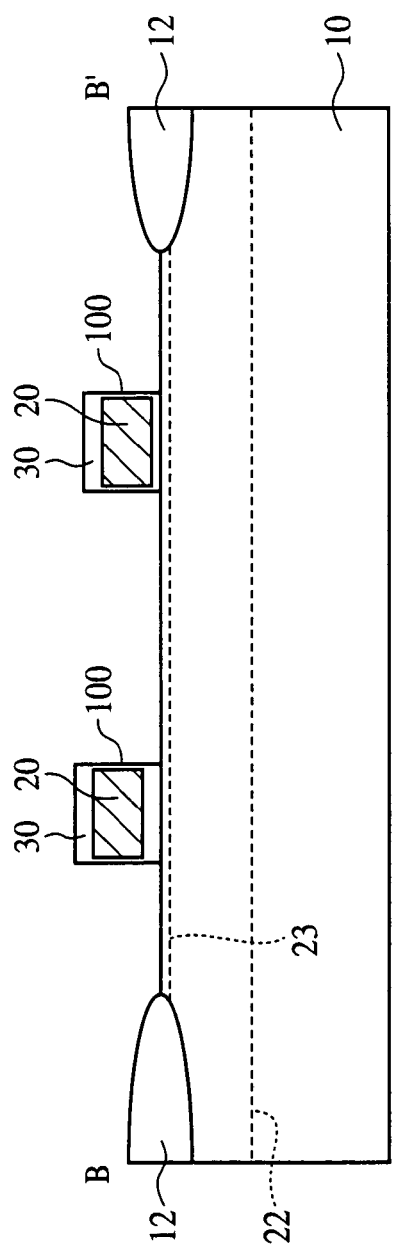

Next, as shown in FIGS. 18A and 18B, the insulation film 30 and the polysilicon film 94 are patterned by photolithography. Thus, the floating gate electrode 20, the gate electrode 28, the gate electrode of the logic transistor, etc. (not shown) are formed. According to the present embodiment, the floating gate electrode 20 and the other gate electrodes can be concurrently by using the photoresist film 94.

Next, the silicon oxide film 100 is formed on the side wall of the polysilicon film 94 by thermal oxidation.

Figure 19A:
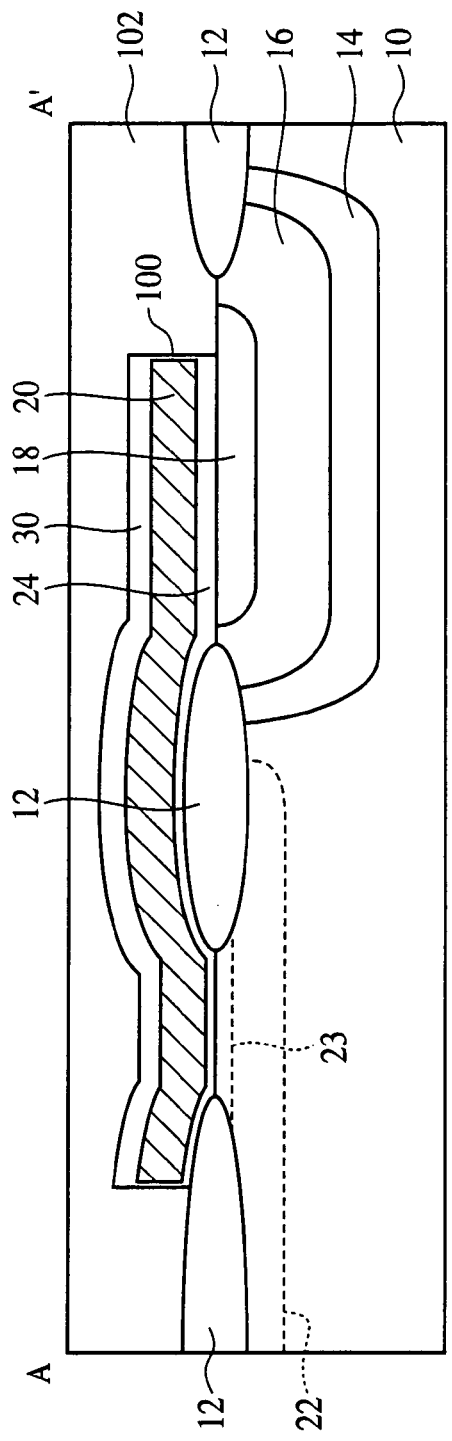
FIGS. 19A and 19B are sectional views of the semiconductor device according to the embodiment of the present invention in the steps of the method for fabricating the semiconductor device, which show the method (Part 15).
Figure 19B:
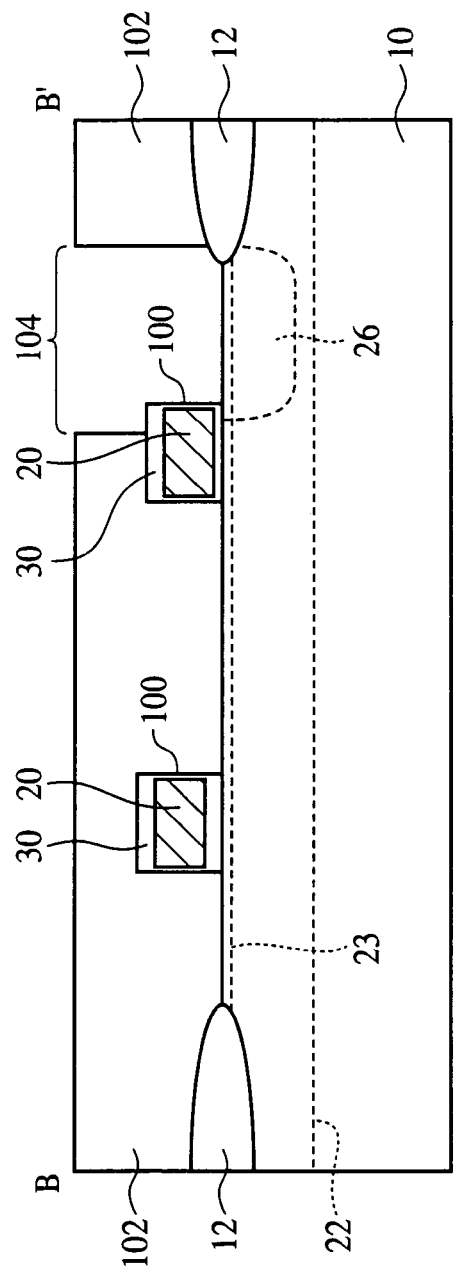

Then, as shown in FIGS. 19A and 19B, a photoresist film 102 is formed on the entire surface by, e.g., spin coating. Next, an opening 104 is formed in the photoresist film 102 down to the semiconductor substrate 10. The opening 104 is for forming the impurity diffused layer 26.

Next, with the photoresist film 102 as the mask, an n-type dopant is heavily implanted into the semiconductor substrate 10 by, e.g, ion implantation. The dopant is phosphorus and arsenic. Conditions for the ion implanting of the phosphorus are, e.g., a 60 keV acceleration energy and a $2.5 \times 10^{14}$ cm$^{-2}$ dose. Conditions for the ion implantation of the arsenic are, e.g., 60 keV acceleration energy and a $6 \times 10^{15}$ cm$^{-2}$ dose. Thus, the impurity diffused layer 26 which functions as the source region is formed.

Figure 20A:
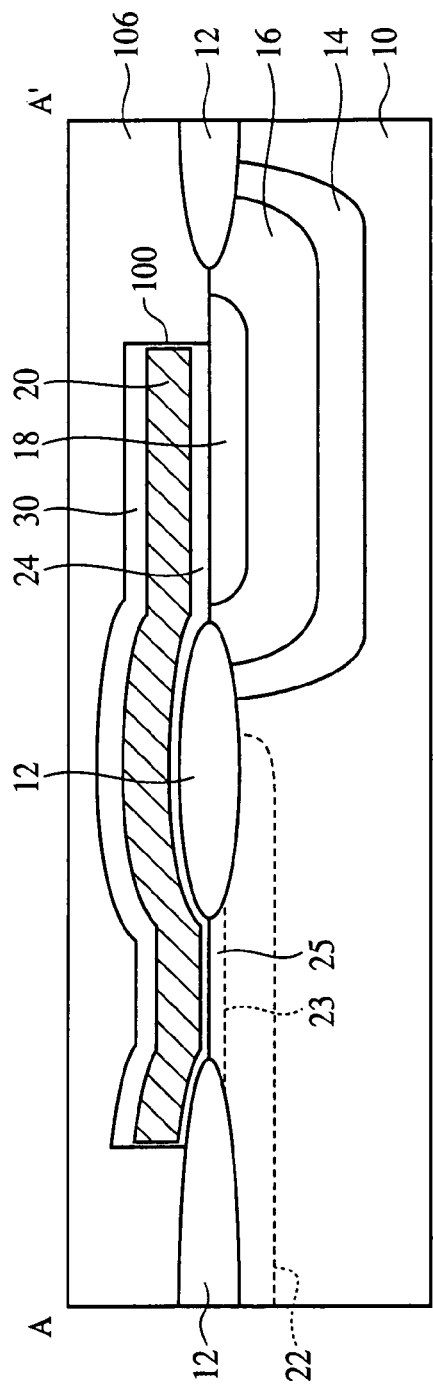
FIGS. 20A and 20B are sectional views of the semiconductor device according to the embodiment of the present invention in the steps of the method for fabricating the semiconductor device, which show the method (Part 16).
Figure 20B:
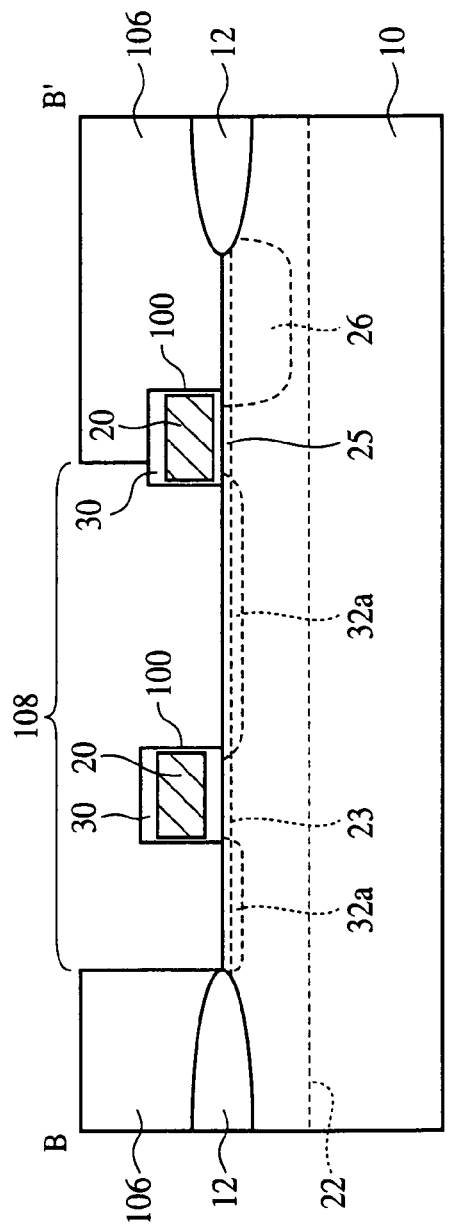

Then, as shown in FIGS. 20A and 20B, a photoresist film 106 is formed on the entire surface by, e.g., spin coating. Then, an opening 108 is formed in the photoresist film 106 down to the semiconductor substrate 10.

Next, with the photoresist film 106, the floating gate electrode 20 and the select gate electrode 28 as the mask, an n-type dopant is implanted into the semiconductor substrate 10. The dopant is, e.g., phosphorus. Conditions for the ion implantation are, e.g., a 60 keV acceleration energy and a $2.3 \times 10^{13}$ cm$^{-2}$. Thus, the lightly doped diffused layer 32a is formed. Then, the photoresist film 106 is released.

Figure 21A:
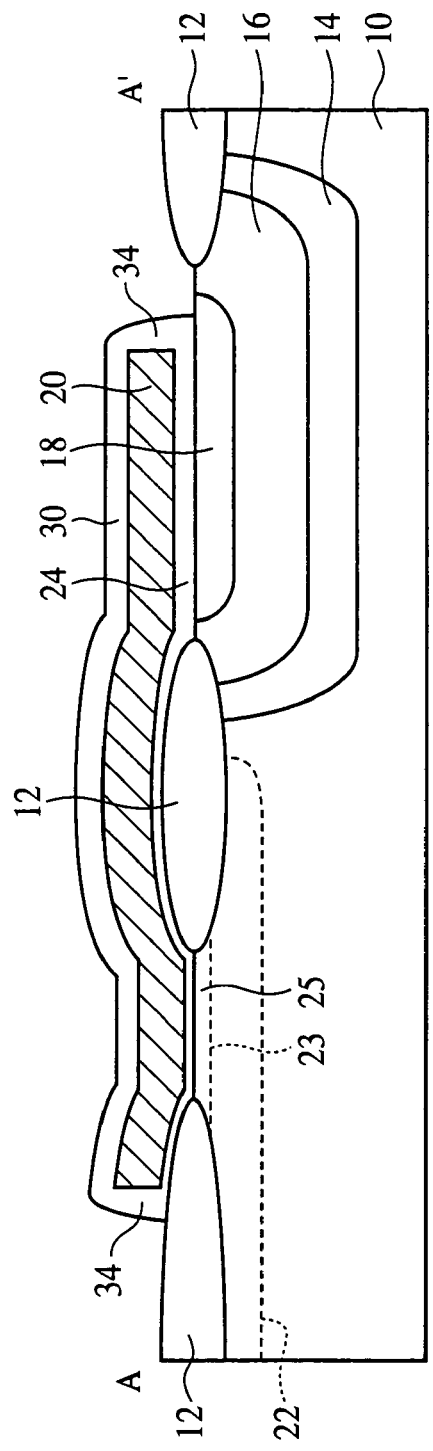
FIGS. 21A and 21B are sectional views of the semiconductor device according to the embodiment of the present invention in the steps of the method for fabricating the semiconductor device, which show the method (Part 17).
Figure 21B:
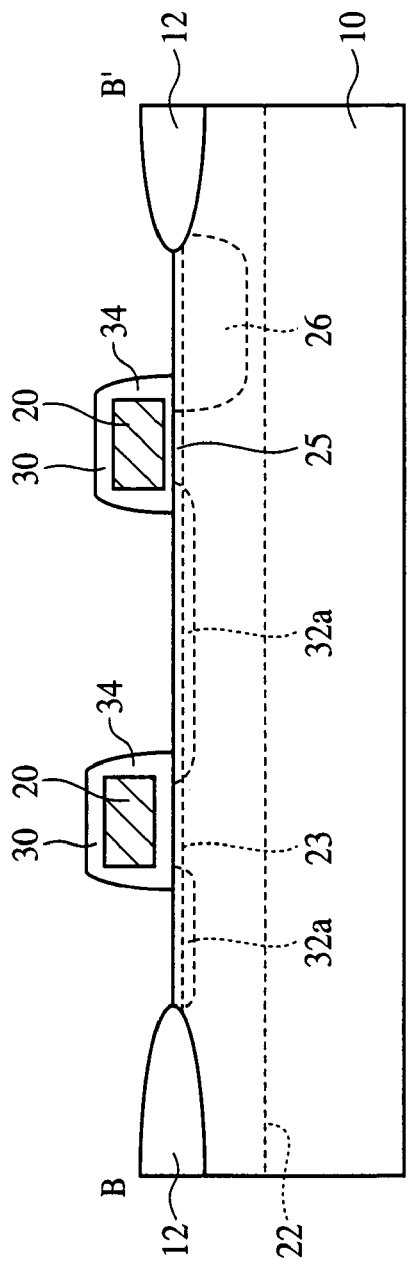

Then, an insulation film is formed on the entire surface by, e.g., CVD. As the insulation film, a silicon oxide film, for example, is formed. The film thickness of the insulation film is, e.g., 250 nm. Then, the insulation film is anisotropically etched. Thus, the sidewall insulation film 34 is formed, as shown in FIGS. 21A and 21B, on the side walls of the floating gate electrode 20 and the gate electrode 28.

Figure 22A:
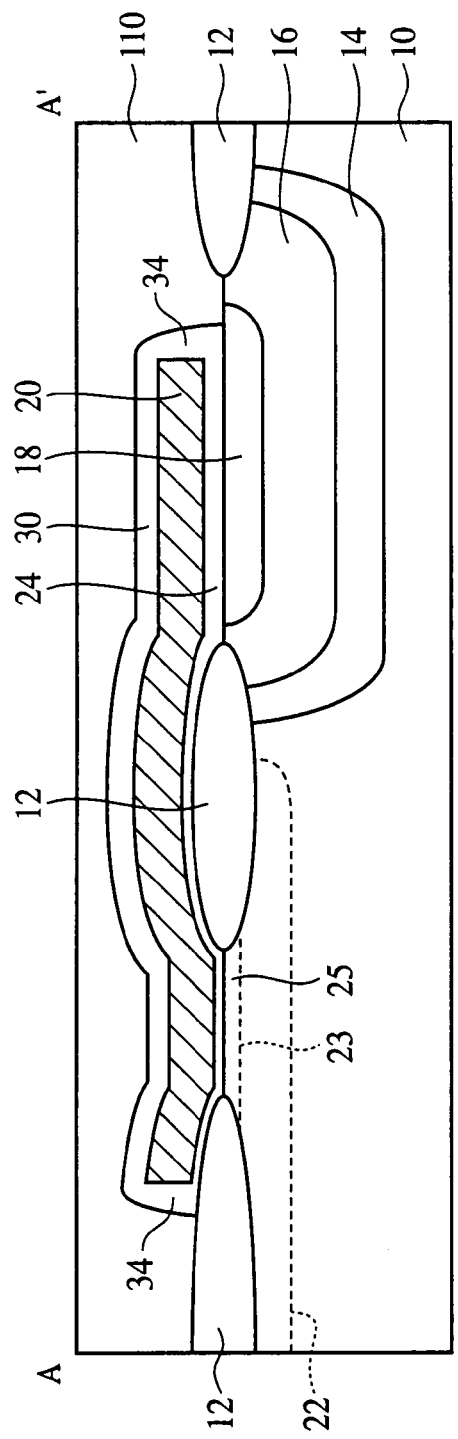
FIGS. 22A and 22B are sectional views of the semiconductor device according to the embodiment of the present invention in the steps of the method for fabricating the semiconductor device, which show the method (Part 18).
Figure 22B:
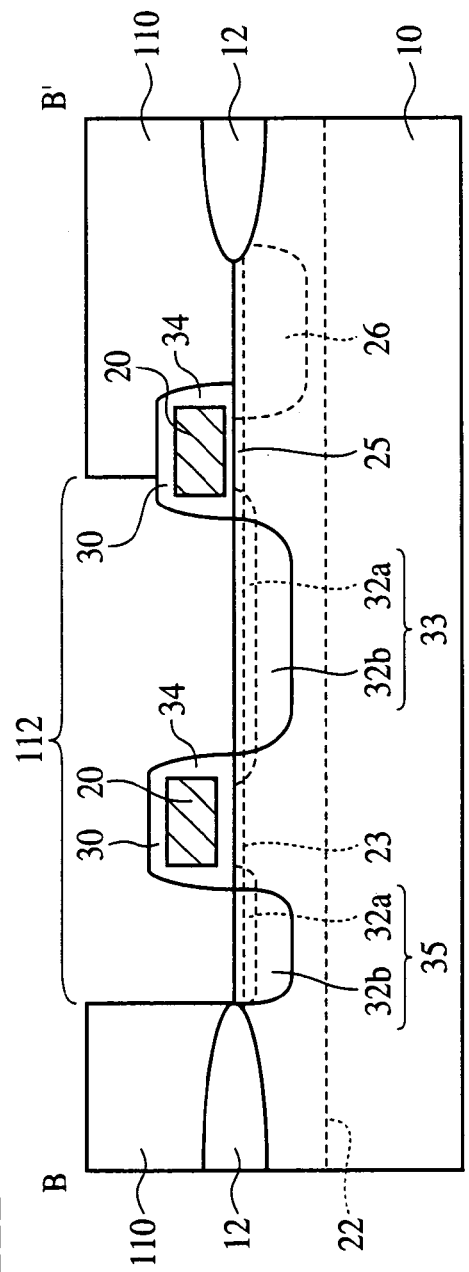

Next, as shown in FIGS. 22A and 22B, a photoresist film 110 is formed on the entire surface by, e.g., spin coating. Then, an opening 112 is formed in the photoresist film 110 down to the semiconductor substrate 10.

Next, with the photoresist film 110, the floating gate electrode 20, the gate electrode 28 and the sidewall insulation film 34 as the mask, an n-type dopant is implanted into the semiconductor substrate 10. Thus, the heavily doped diffused layer 32b is formed.

The lightly doped diffused layer 32a and the heavily doped diffused layer 32b form the impurity diffused layer 33. The lightly doped diffused layer 32a and the heavily doped diffused layer 32b form the impurity diffused layer 35. Then, the photoresist film 110 is released.

Figure 23A:
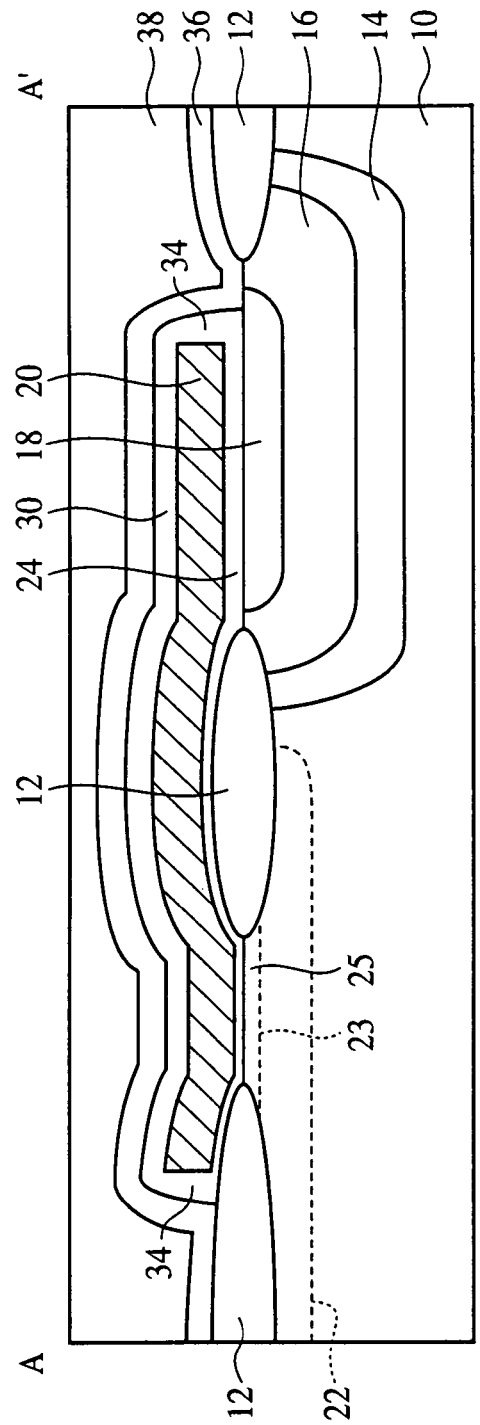
FIGS. 23A and 23B are sectional views of the semiconductor device according to the embodiment of the present invention in the steps of the method for fabricating the semiconductor device, which show the method (Part 19).
Figure 23B:
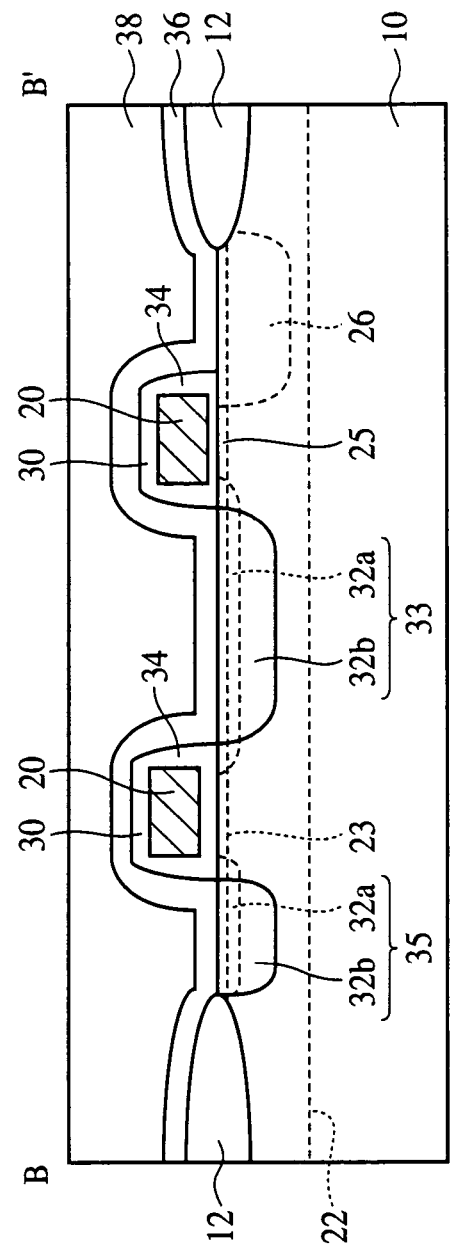

Next, as shown in FIGS. 23A and 23B, the insulation film 36 is formed on the entire surface by, e.g., CVD. As the insulation film 36, a silicon oxide film, for example, is formed. The film thickness of the insulation film 36 is, e.g., 100 nm.

Then, an inter-layer insulation film is formed on the entire surface by, e.g., CVD. As the inter-layer insulation film, a BPSG film, for example, is formed. The film thickness of the inter-layer insulation film is, e.g., 900 nm.

Figure 24A:
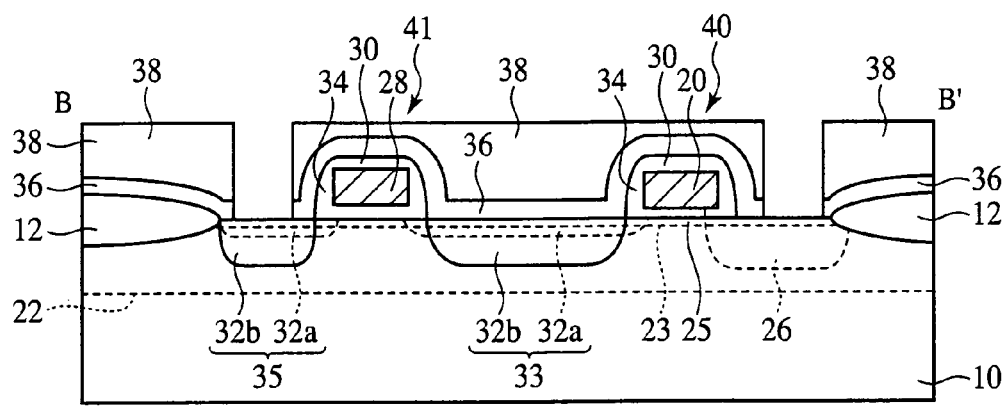
FIGS. 24A and 24B are sectional views of the semiconductor device according to the embodiment of the present invention in the steps of the method for fabricating the semiconductor device, which show the method (Part 20).

Then, as shown in FIG. 24A, the contact holes 42 are formed respectively in the inter-layer insulation film 38 and the insulation film 36 respectively down to the impurity diffused layers 26, 35.

Figure 24B:
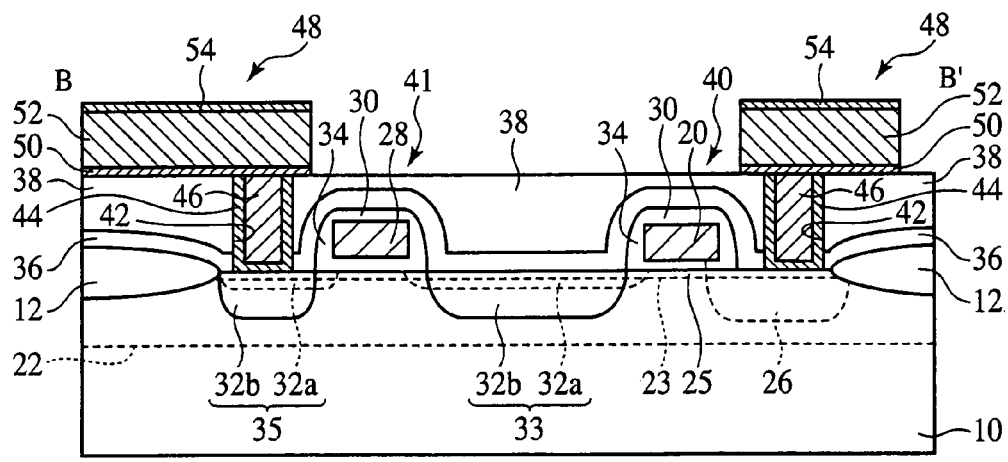

Next, as shown in FIG. 24B, the barrier metal 44 is formed on the insides of the contact holes 42. The material of the barrier metal 44 is, e.g., titanium nitride.

Then, in the contact holes 42 with the barrier metal 44 formed on the insides, the contact plugs 46 are buried. The material of the contact plugs 46 is, e.g., tungsten.

Next, the layer film of a barrier metal 50, a metal film 52 and a barrier metal 54 is formed on the inter-layer insulation film 38. Then, the layer film is patterned by photolithography. Thus, the interconnection 48 of the layer film is formed.

Figure 25A:
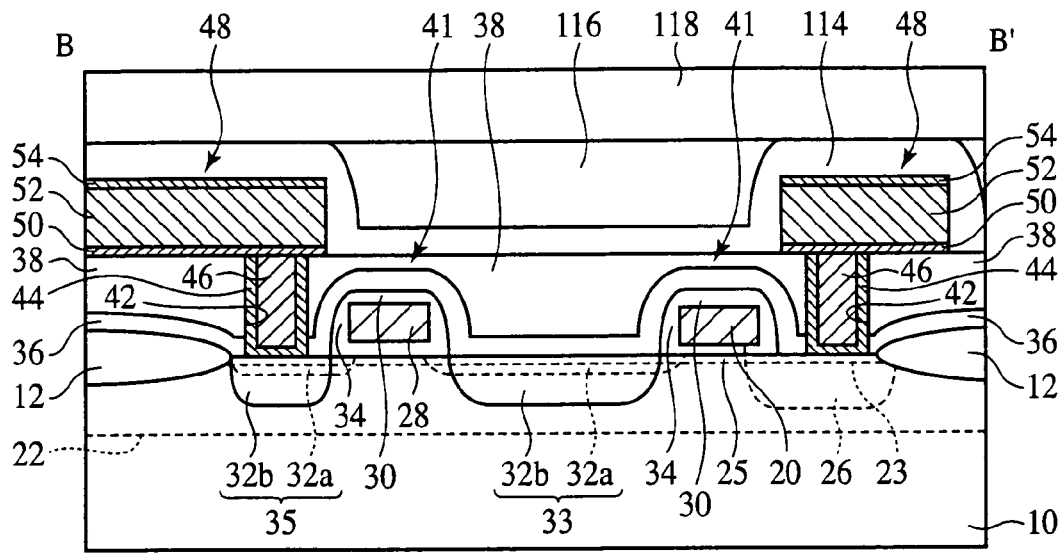
FIGS. 25A and 25B are sectional views of the semiconductor device according to the embodiment of the present invention in the steps of the method for fabricating the semiconductor device, which show the method (Part 21).

Then, as shown in FIG. 25A, the insulation film 114 is formed on the entire surface by, e.g., CVD. The insulation film 114 is, e.g., plasma oxide nitride film. The film thickness of the insulation film 114 is, e.g., 500 nm.

Then, the insulation film 116 is formed on the entire surface by, e.g., spin coating. The insulation film 116 is, e.g., SOG (Spin On Glass) film. The film thickness of the insulation film 116 is, e.g., 500 nm.

Next, the surface of the insulation film 116 is etched by, e.g., overall etching until the surface of the insulation film 114 is exposed.

Then, the inter-layer insulation film 118 is formed on the entire surface by, e.g., plasma CVD. The material of the inter-layer insulation film 118 is, e.g., silicon oxide film. The film thickness of the inter-layer insulation film 118 is, e.g., 400 nm.

Figure 25B:
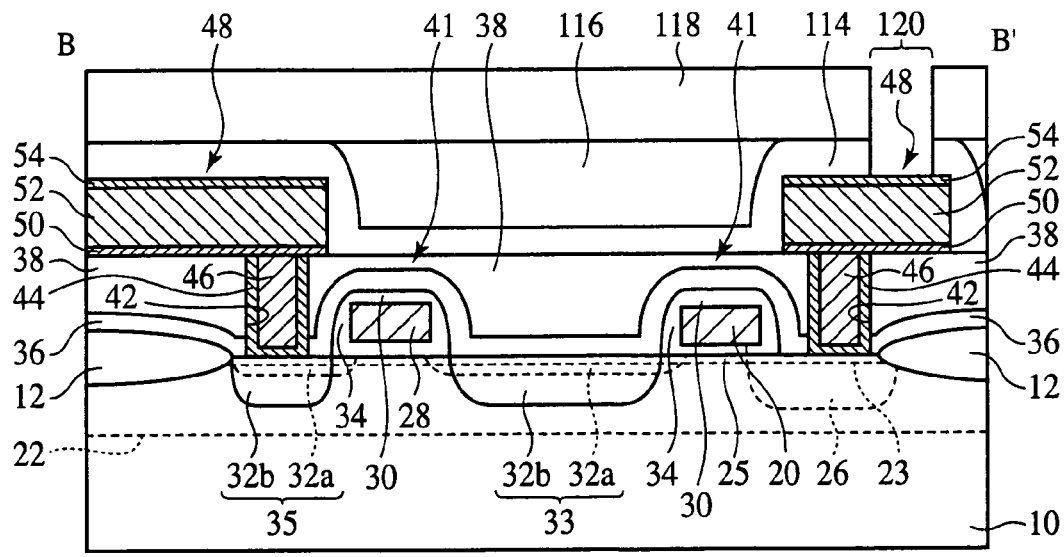

Next, as shown in FIG. 25B, the contact holes 120 are formed in the inter-layer insulation film 118 and the insulation film 114 down to the interconnection 48.

Figure 26:
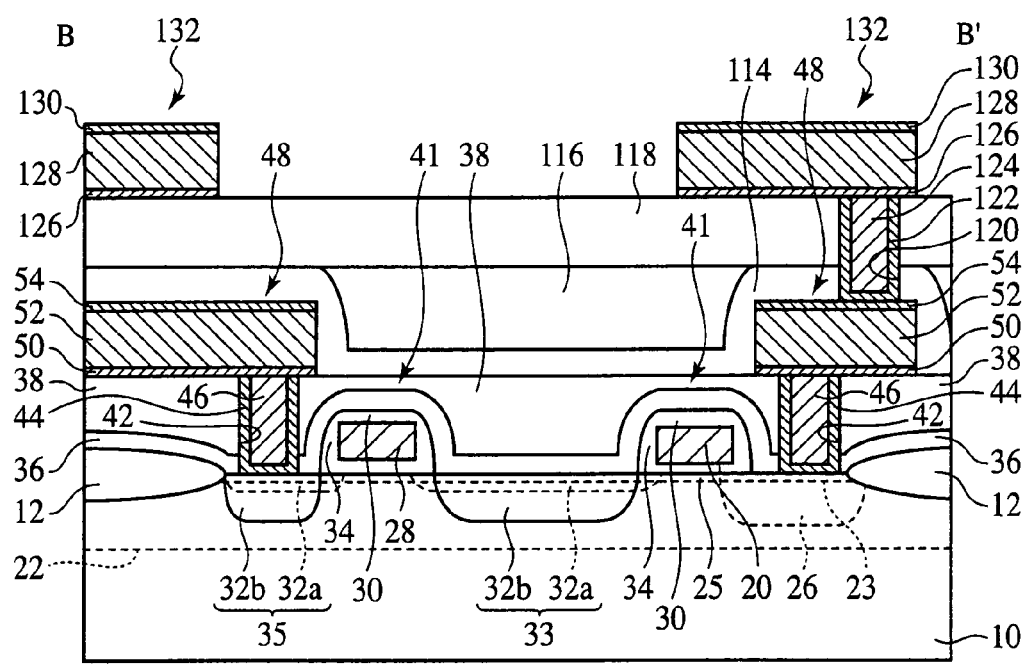
FIG. 26 is a sectional view of the semiconductor device according to the embodiment of the present invention in the steps of the method for fabricating the semiconductor device, which show the method (Part 22).

Next, as shown in FIG. 26, the barrier metal 122 is formed on the inside of the contact hole 120. The material of the barrier metal 122 is, e.g., titanium nitride.

Then, in the contact hole 120 with the barrier metal 122 formed on the inside, the contact plug 124 is buried. The material of the contact plug 124 is, e.g., tungsten.

Then, the layer film of a barrier metal 126, a metal film 128 and a barrier metal 130 is formed on the inter-layer insulation film 118. Then, the layer film is patterned by photolithography. Thus, the interconnection 132 of the layer film is formed.

Figure 27:
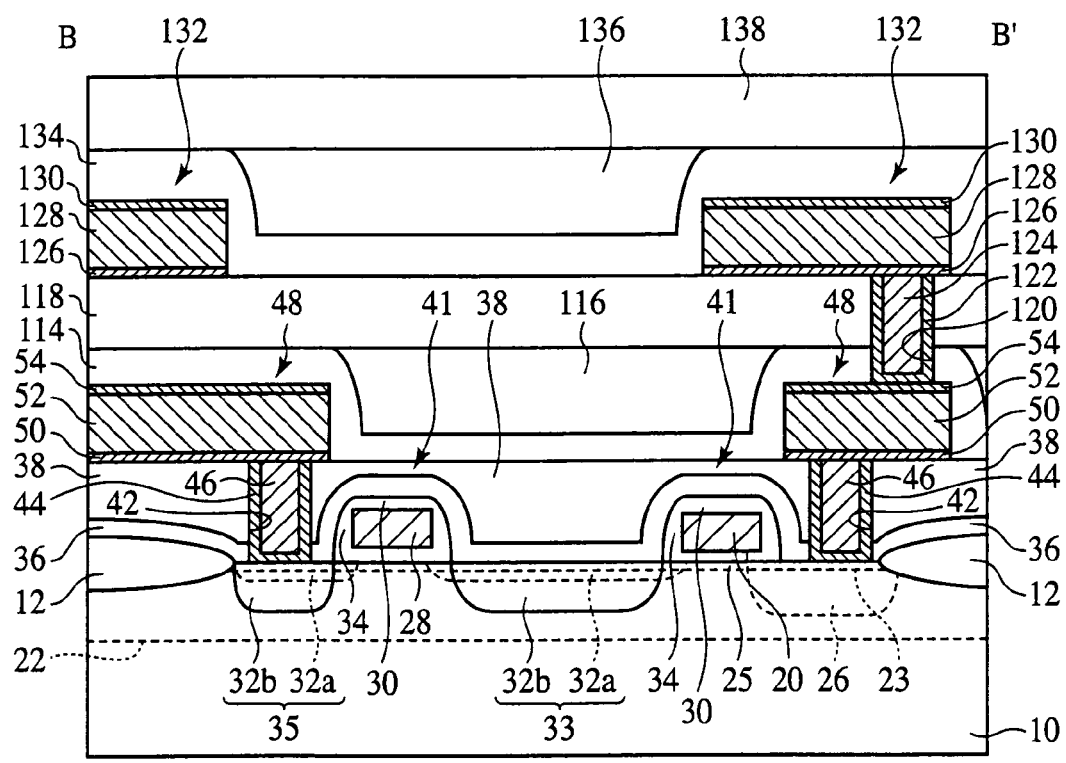
FIG. 27 is a sectional view of the semiconductor device according to the embodiment of the present invention in the steps of the method for fabricating the semiconductor device, which show the method (Part 23).
Figure 28:
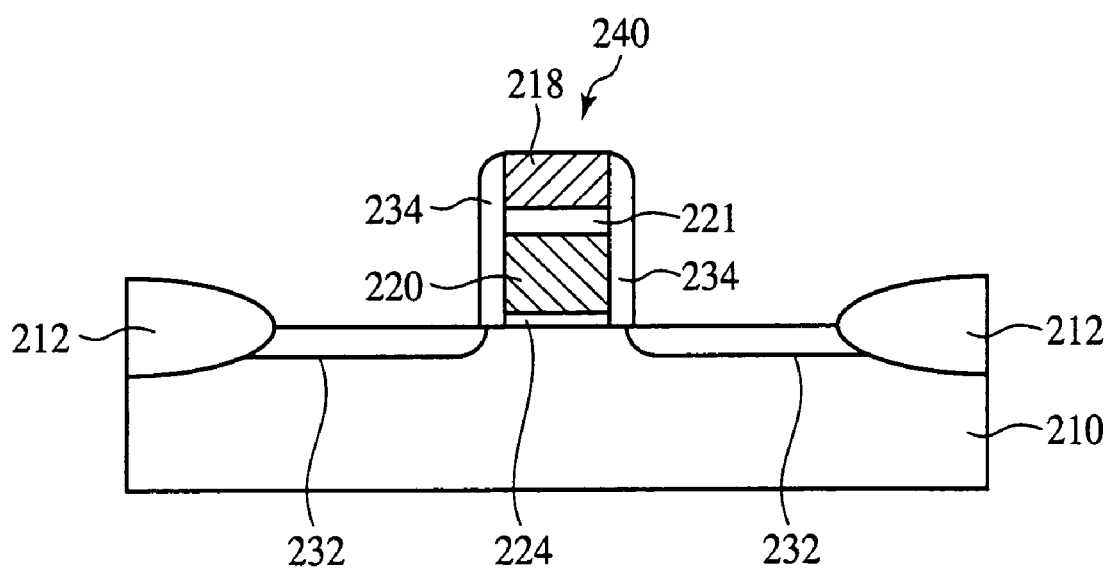
FIG. 28 is a sectional view of the conventional semiconductor device.

Next, as shown in FIG. 27, the insulation film 134 is formed on the entire surface by, e.g., CVD. As the insulation film 134, a silicon oxide film, for example is used. The film thickness of the insulation film 134 is, e.g., 500 nm.

Then, the insulation film 136 is formed on the entire surface by, e.g., spin coating. As the insulation film 136, an SOG film, for example is used. The film thickness of the insulation film 136 is, e.g., 500 nm.

Next, the surface of the insulation film 136 is polished by, e.g., CMP until the surface of the insulation film 134 is exposed.

Then, the inter-layer insulation film 138 is formed on the entire surface by, e.g., CVD. As the inter-layer insulation film 138, a silicon nitride film, for example, us used. The film thickness of the inter-layer insulation film 138 is, e.g., 500 nm.

Thus, the semiconductor device according to the present embodiment is fabricated.

As described above, in the present embodiment, the control gate 18 is buried in the semiconductor substrate 10, which permits the memory transistor 40 and the other transistors to be formed by the same fabrication process. Thus, according to the present embodiment, the fabrication processes can be less, and the semiconductor device can be fabricated at low costs.

[Modified Embodiments]

The present invention is not limited to the above-described embodiment and can cover other various modifications.

For example, in the above-described embodiment, the p-type well is formed in the n-type well, and the n-type control gate is formed in the p-type well. However, it is possible that the n-type well is formed in the p-type well, and the p-type control gate is formed in the n-type well.

In the above-described embodiment, the memory transistors and other transistors which are field effect transistors are hybridized. However, the memory transistors and bipolar transistors may be hybridized. That is, the memory transistors and CMOS circuits may be hybridized, and the memory transistors and BiCMOS circuits may be hybridized. Even in hydbridizing the memory transistors and BiCMOS circuits, according to the present invention, the fabrication processes can be less, and the cost reduction can be realized, as can be in the above-described embodiment.

What is claimed is:

1. A semiconductor device comprising:
   a first well of a first conduction type formed in a semiconductor substrate;
   a second well of a second conduction type formed in the first well; and
   a transistor including a control gate formed of an impurity region of the first conduction type formed in the second well, a first impurity diffused layer and a second impurity diffused layer formed outside the first well with a channel region therebetween, and a floating gate electrode formed on the channel region and the control gate with a gate insulation film therebetween,
   wherein an area of a first region where the control gate and the floating gate electrode are opposed to each other is larger than an area of a second region where the channel region and the floating gate electrode are opposed to each other, and
   the area of the first region is 10 or more times as large as the area of the second region.

2. The semiconductor device according to claim 1, wherein
   carriers are caused to tunnel the gate insulation film between the channel region and the floating gate electrode to write information into the floating gate electrode and to erase information from the floating gate electrode.

3. The semiconductor device according to claim 1, wherein
   the area of the first region is 40 or more times as large as the area of the second region.

4. The semiconductor device according to claim 1, wherein
   a film thickness of the gate insulation film present between the channel region and the floating gate electrode is smaller than a film thickness of the gate insulation film present between the control gate and the floating gate electrode.

5. A The semiconductor device according to claim 1, which further comprises another transistor including a gate electrode formed on the semiconductor substrate with another gate insulation film therebetween, and
   in which a film thickness of said another gate insulation film between the gate electrode of the said another transistor and the semiconductor substrate is larger than a film thickness of the gate insulation film present between the channel region and the floating gate electrode.

6. The semiconductor device according to claim 1, which comprises a plurality of said transistors, and
   in which the control gates of said plurality of transistors is formed as integral.

7. A The semiconductor device according to claim 1, which further comprises:
   a first transistor array of a plurality of said transistors formed in one region of the semiconductor substrate;
   a second transistor array of a plurality of said transistors formed in another region of the semiconductor substrate adjacent to said one region; and
   a contact plug connected to the semiconductor substrate in a region between said one region and said another region, and
   in which the semiconductor substrate is grounded via the contact plug.

8. A semiconductor device comprising:
   a first well of a first conduction type formed in a semiconductor substrate;
   a second well of a second conduction type formed in the first well; and
   a transistor including a control gate formed of an impurity region of the first conduction type formed in the second well, a first impurity diffused layer and a second impurity diffused layer formed outside the first well with a channel region therebetween, and a floating gate electrode formed on the channel region and the control gate with a gate insulation film therebetween, which further comprises another transistor including a gate electrode formed of one and the same layer as the floating gate electrode, and in which a concentration of a dopant implanted in the floating gate electrode is lower than a concentration of a dopant implanted in the gate electrode of said another transistor.

9. The semiconductor device according to claim 8, wherein, carriers are caused to tunnel the gate insulation film between the channel region and the floating gate electrode to write information into the floating gate electrode and to erase information from the floating gate electrode.

10. The semiconductor device according to claim 8, wherein, a film thickness of the gate insulation film present between the channel region and the floating gate electrode is smaller than a film thickness of the gate insulation film present between the control gate and the floating gate electrode.

11. The semiconductor device according to claim 8, which further comprises another transistor including a gate electrode formed on the semiconductor substrate with another gate insulation film therebetween, and in which a film thickness of said another gate insulation film between the gate electrode of the said another transistor and the semiconductor substrate is larger than film thickness of the gate insulation film present between the channel region and the floating gate electrode.

12. The semiconductor device according to claim 8, which comprises a plurality of said transistors, and in which the control gates of said plurality of transistors is formed as integral.

13. The semiconductor device according to claim 8, which further comprises:

a first transistor array of a plurality of said transistors formed in one region of the semiconductor substrate;

a second transistor array of a plurality of said transistors formed in another region of the semiconductor substrate adjacent to said one region; and a contact plug connected to the semiconductor substrate in a region between said one region and said another region, and in which the semiconductor substrate is grounded via the contact plug.

14. A semiconductor device comprising:

a first well of a first conduction type formed in a semiconductor substrate;

a second well of a second conduction type formed in the first well; and a transistor including a control gate formed of an impurity region of the first conduction type formed in the second well, a first impurity diffused layer and a second impurity diffused layer formed outside the first well with a channel region therebetween, and a floating gate electrode formed on the channel region and the control gate with a gate insulation film therebetween, a carrier concentration of an edge part of the first impurity diffused layer on the side of the floating gate electrode is higher than a carrier concentration of an edge part of the second impurity diffused layer on the side of the floating gate electrode.

15. The semiconductor device according to claim 14, wherein, carriers are caused to tunnel the gate insulation film between the channel region and the floating gate electrode to write information into the floating gate electrode and to erase information from the floating gate electrode.

16. The semiconductor device according to claim 14, wherein a film thickness of the gate insulation film present between the channel region and the floating gate electrode is smaller than a film thickness of the gate insulation film present between the control gate and the floating gate electrode.

17. The semiconductor device according to claim 14, which further comprises another transistor including a gate electrode formed on the semiconductor substrate with another gate insulation film therebetween, and in which a film thickness of said another gate insulation film between the gate electrode of the said another transistor and the semiconductor substrate is larger than a film thickness of the gate insulation film present between the channel region and the floating gate electrode.

18. The semiconductor device according to claim 14, which comprises a plurality of said transistors, and in which the control gates of said plurality of transistors is formed as integral.

19. The semiconductor device according to claim 14, which further comprises:

a first transistor array of a plurality of said transistors formed in one region of the semiconductor substrate;

a second transistor array of a plurality of said transistors formed in another region of the semiconductor substrate adjacent to said one region; and a contact plug connected to the semiconductor substrate in a region between said one region and said another region, and in which the semiconductor substrate is grounded via the contact plug.

* * * * *